US012665028B2

(12) United States Patent
Lemke et al.

(10) Patent No.: US 12,665,028 B2
(45) Date of Patent: Jun. 23, 2026

(54) ULTRA-PRECISE TUNING OF NEURAL MEMORY CELLS

(71) Applicant: Silicon Storage Technology, Inc., San Jose, CA (US)

(72) Inventors: Steven Lemke, Boulder Creek, CA (US); Hieu Van Tran, San Jose, CA (US); Yuri Tkachev, Sunnyvale, CA (US); Louisa Schneider, San Jose, CA (US); Henry A. Om'mani, Santa Clara, CA (US); Thuan Vu, San Jose, CA (US); Nhan Do, Saratoga, CA (US); Vipin Tiwari, Dublin, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 1032 days.

(21) Appl. No.: 17/850,447

(22) Filed: Jun. 27, 2022

(65) Prior Publication Data

US 2022/0336020 A1      Oct. 20, 2022

Related U.S. Application Data

(62) Division of application No. 16/985,147, filed on Aug. 4, 2020, now Pat. No. 11,393,535.

(Continued)

(51) Int. Cl.
| | |
|---|---|
| *G11C 11/54* | (2006.01) |
| *G06N 3/063* | (2023.01) |
| *G11C 16/10* | (2006.01) |
| *G11C 16/14* | (2006.01) |
| *G11C 16/26* | (2006.01) |

(52) U.S. Cl.
CPC ............. *G11C 16/10* (2013.01); *G06N 3/063* (2013.01); *G11C 16/14* (2013.01); *G11C 16/26* (2013.01); *G11C 11/54* (2013.01)

(58) Field of Classification Search
CPC ................................ G11C 11/54; H10B 41/35
See application file for complete search history.

(56) References Cited

U.S. PATENT DOCUMENTS

| | | |
|---|---|---|
| 5,029,130 A | 7/1991 | Yeh |
| 6,747,310 B2 | 6/2004 | Fan |

(Continued)

FOREIGN PATENT DOCUMENTS

| | | |
|---|---|---|
| JP | 2010-123210 A | 6/2010 |
| JP | 2010-530112 A | 9/2010 |

(Continued)

OTHER PUBLICATIONS

Taiwanese Search Report from Notice of Allowance dated Jun. 16, 2022 corresponding to the related Taiwanese Patent Application No. 111105352.

(Continued)

*Primary Examiner* — Jason Lappas
(74) *Attorney, Agent, or Firm* — Vedder Price P.C.

(57) ABSTRACT

Examples for ultra-precise tuning of a selected memory cell are disclosed. In one example, a method of programming a first memory cell in a neural memory to a target value is disclosed, the method comprising programming a second memory cell by applying programming voltages to terminals of the second memory cell; and determining if an output of the first memory cell has reached the target value.

21 Claims, 27 Drawing Sheets

Related U.S. Application Data

(60) Provisional application No. 62/981,757, filed on Feb. 26, 2020.

(56) References Cited

U.S. PATENT DOCUMENTS

| | | | |
|---|---|---|---|
| 8,000,141 B1 | 8/2011 | Shalvi | |
| 2007/0252192 A1 | 11/2007 | Moklesi | |
| 2014/0254265 A1 | 9/2014 | Aritome | |
| 2017/0337466 A1 | 11/2017 | Bayat | |
| 2018/0268912 A1* | 9/2018 | Guo | H10B 41/35 |
| 2019/0164046 A1* | 5/2019 | Song | G06N 3/063 |
| 2019/0164617 A1 | 5/2019 | Tran | |

FOREIGN PATENT DOCUMENTS

| | | |
|---|---|---|
| JP | 2021-517706 A | 7/2021 |
| TW | I 416712 | 11/2013 |
| WO | 2008 157037 A2 | 12/2008 |
| WO | 2019 177691 A1 | 9/2019 |

OTHER PUBLICATIONS

Japanese Office Action mailed on Sep. 5, 2023 corresponding to the related Japanese Patent Application No. 2022-550938.

\* cited by examiner

**FIGURE 1
(PRIOR ART)**

Programming
Method
1300

1301 — Start

1302 — All cells programmed to '0' state.

1303 — All cells erased to weakly erased level.

1304 — Hard programming performed on un-used cells to turn off the un-used cells.

1305 — Coarse programming method performed on selected cells.

1306 — Precision programming method performed on selected cells.

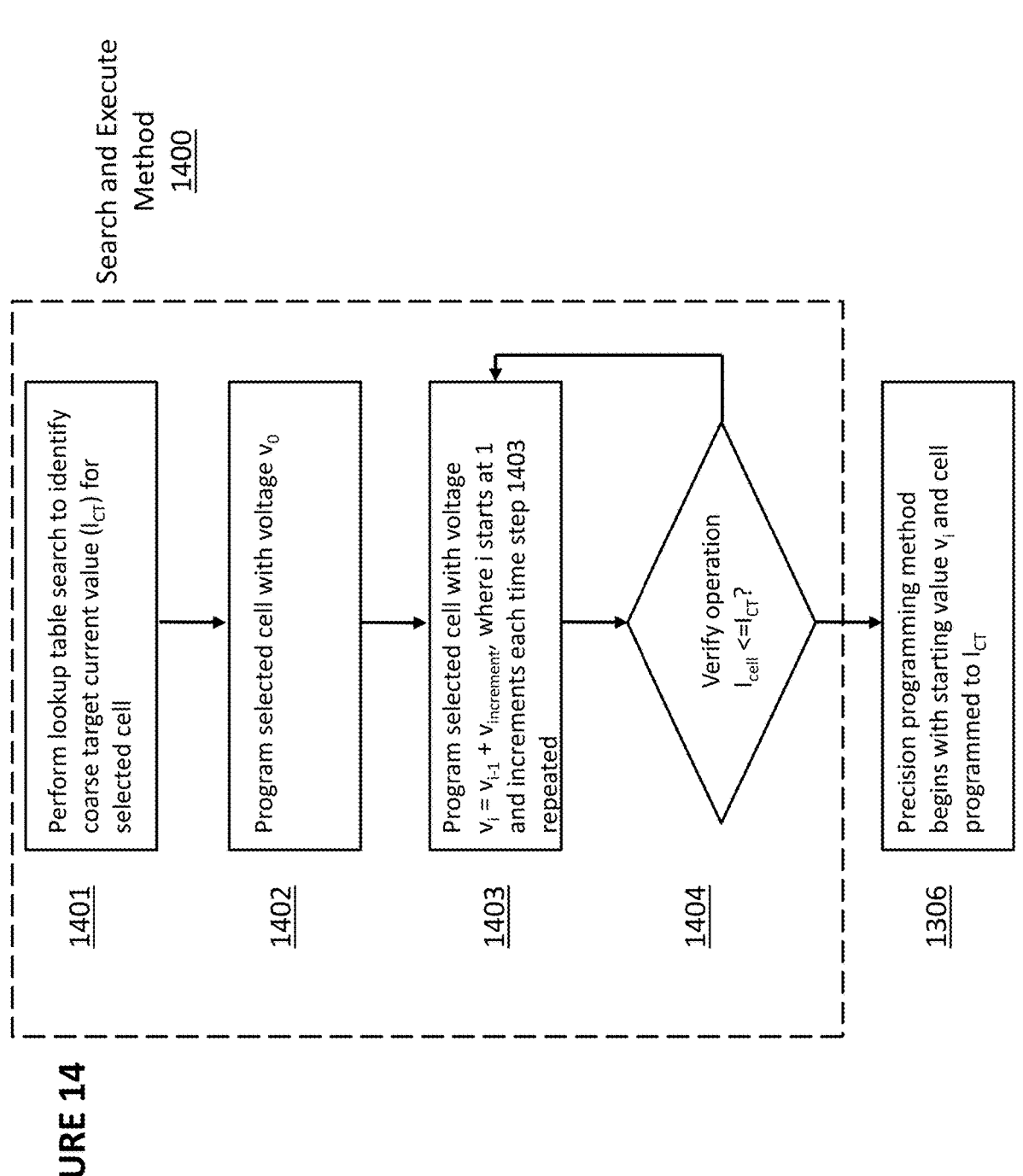

Search and Execute Method 1400

1401 Perform lookup table search to identify coarse target current value ($I_{CT}$) for selected cell

1402 Program selected cell with voltage $v_0$

1403 Program selected cell with voltage $v_i = v_{i-1} + v_{increment}$, where i starts at 1 and increments each time step 1403 repeated

1404 Verify operation $I_{cell} <= I_{CT}$?

1306 Precision programming method begins with starting value $v_i$ and cell programmed to $I_{CT}$

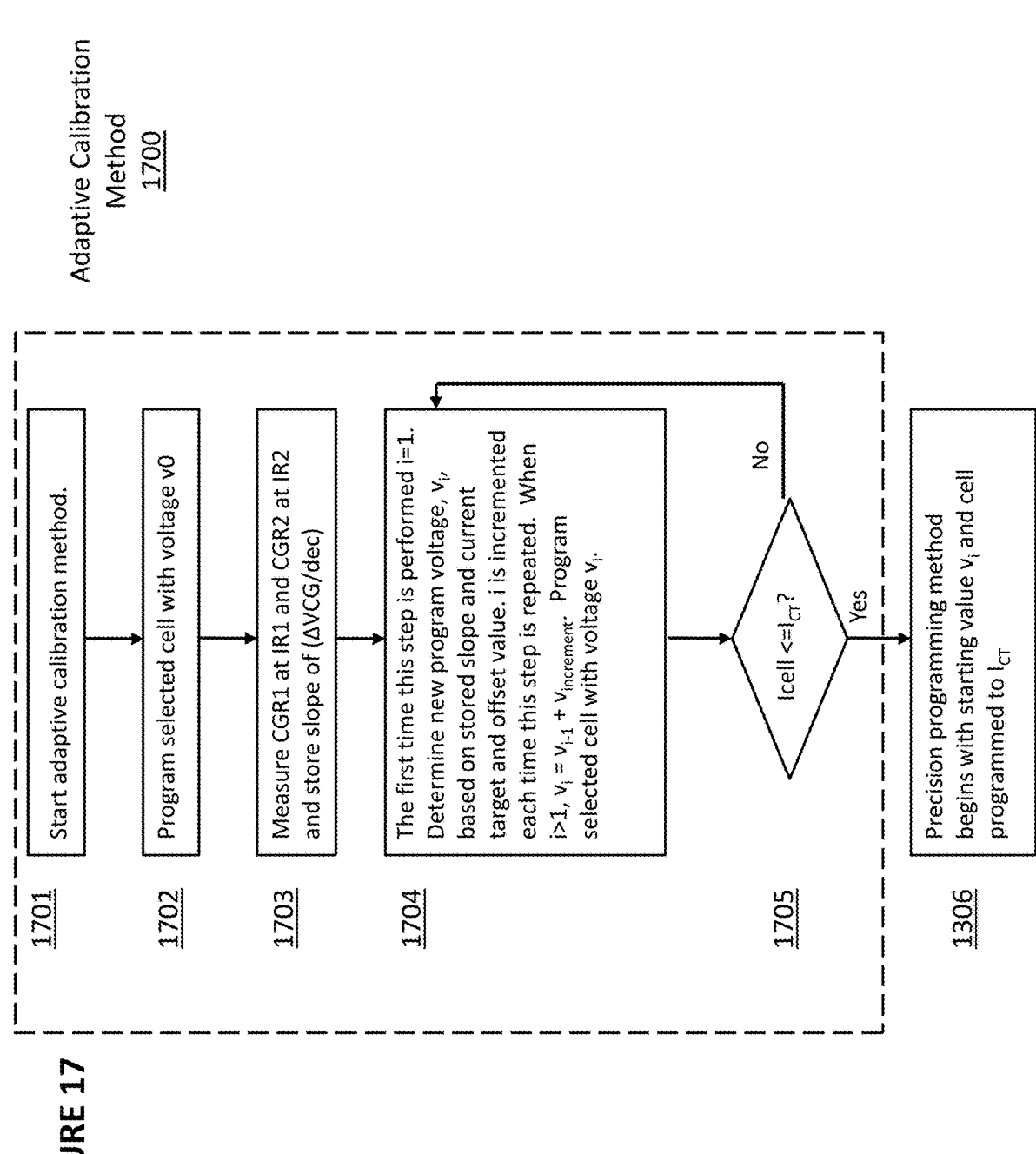

Adaptive Calibration Method
1700

1701 — Start adaptive calibration method.

1702 — Program selected cell with voltage v0

1703 — Measure CGR1 at IR1 and CGR2 at IR2 and store slope of (ΔVCG/dec)

1704 — The first time this step is performed i=1. Determine new program voltage, $v_i$, based on stored slope and current target and offset value. i is incremented each time this step is repeated. When i>1, $v_i = v_{i-1} + v_{increment}$. Program selected cell with voltage $v_i$.

1705 — Icell <=$I_{CT}$?    No / Yes

1306 — Precision programming method begins with starting value $v_i$ and cell programmed to $I_{CT}$

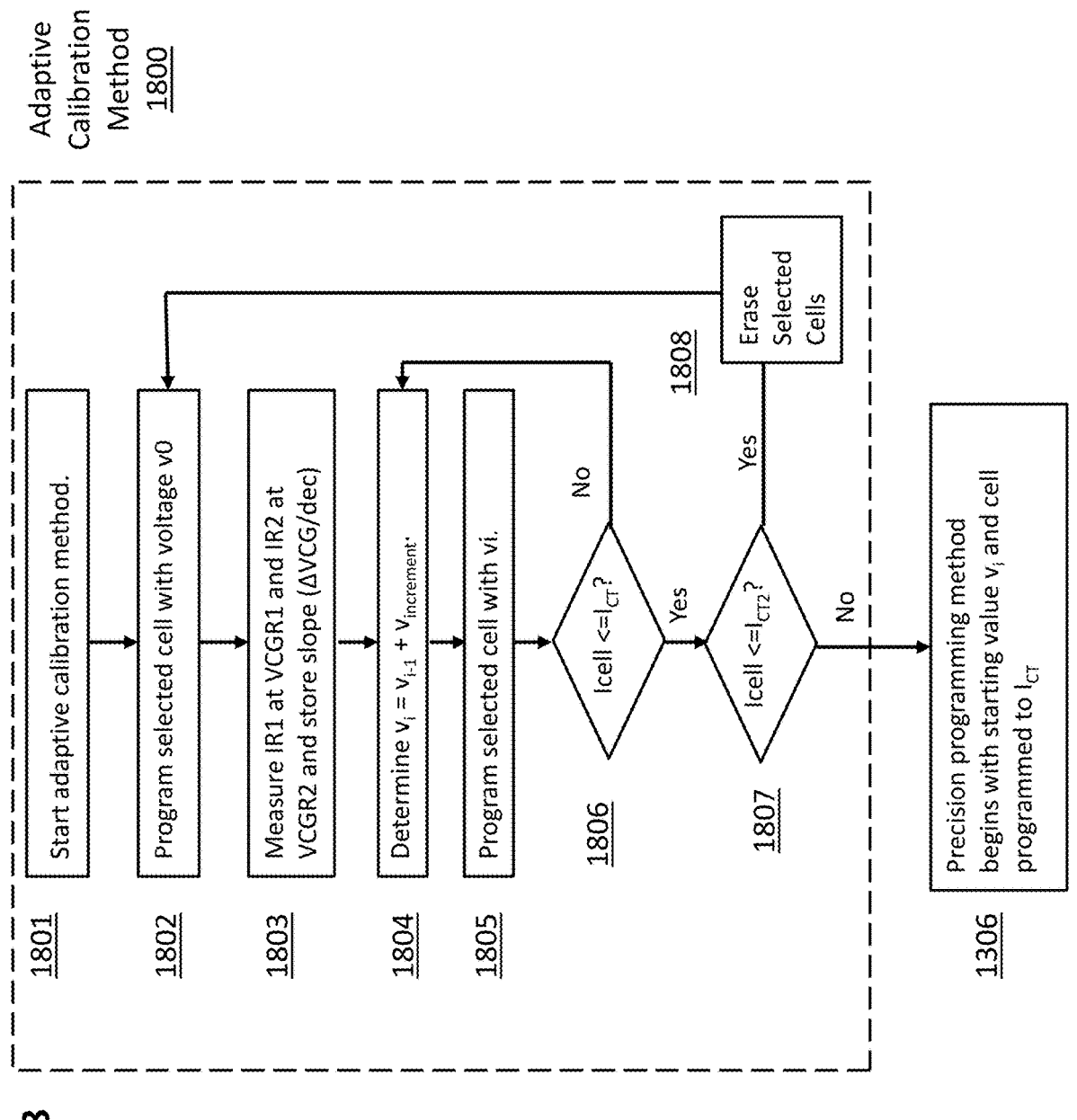

Adaptive Calibration Method 1800

1801 Start adaptive calibration method.

1802 Program selected cell with voltage v0

1803 Measure IR1 at VCGR1 and IR2 at VCGR2 and store slope (ΔVCG/dec)

1804 Determine $v_i = v_{i-1} + v_{increment}$.

1805 Program selected cell with vi.

1806 Icell <=$I_{CT}$? — No / Yes

1808 Erase Selected Cells

1807 Icell <=$I_{CT2}$? — Yes / No

1306 Precision programming method begins with starting value $v_i$ and cell programmed to $I_{CT}$

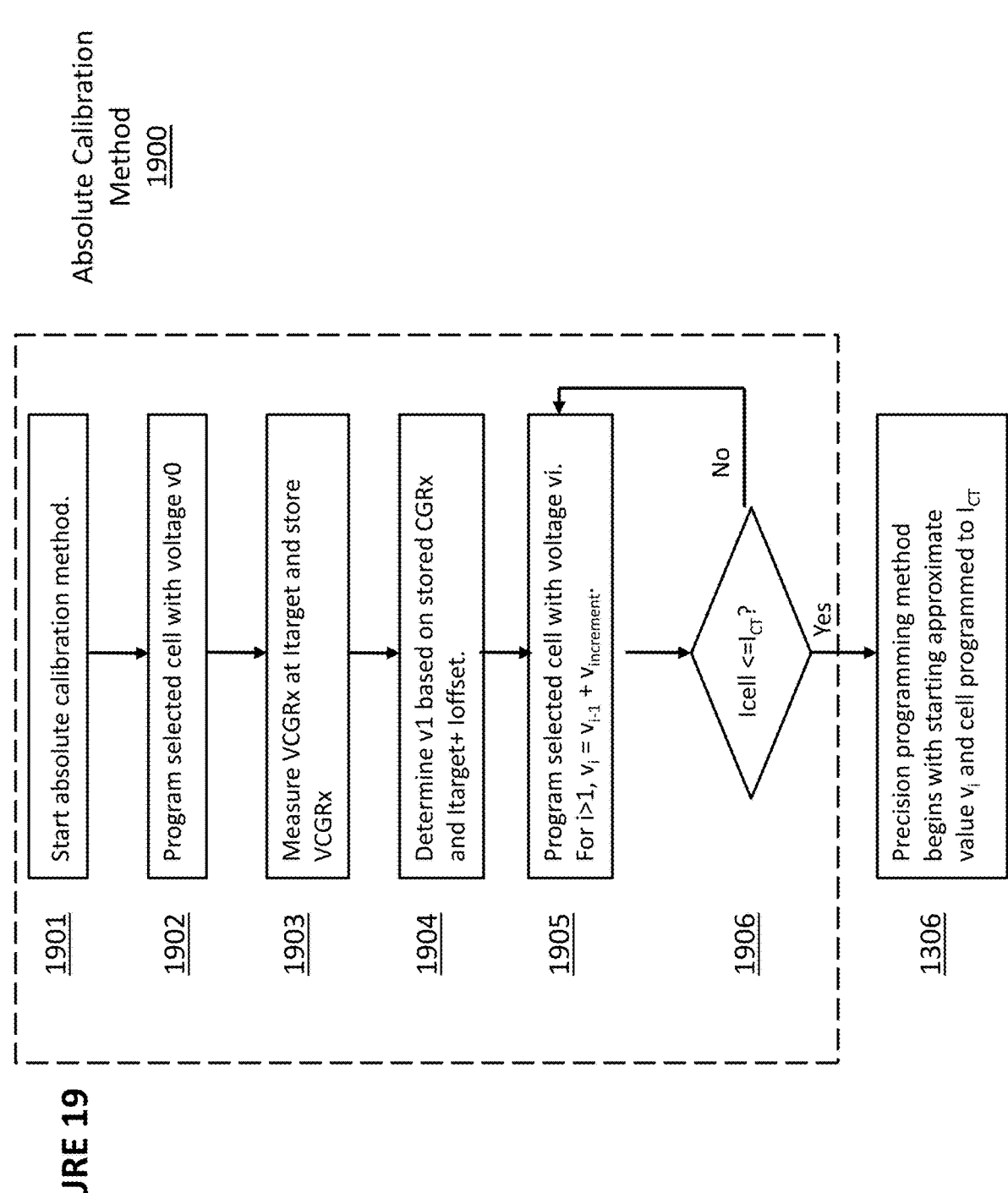

Absolute Calibration Method 1900

1901 — Start absolute calibration method.

1902 — Program selected cell with voltage v0

1903 — Measure VCGRx at Itarget and store VCGRx

1904 — Determine v1 based on stored CGRx and Itarget+ Ioffset.

1905 — Program selected cell with voltage vi. For i>1, $v_i = v_{i-1} + v_{increment}$.

1906 — Icell <=$I_{CT}$?

No

Yes

1306 — Precision programming method begins with starting approximate value $v_i$ and cell programmed to $I_{CT}$ Floating Gate Voltage v. Programming Pulse Count
for Precision Programming Method 1306

Cell Layout
2200

FIGURE 23

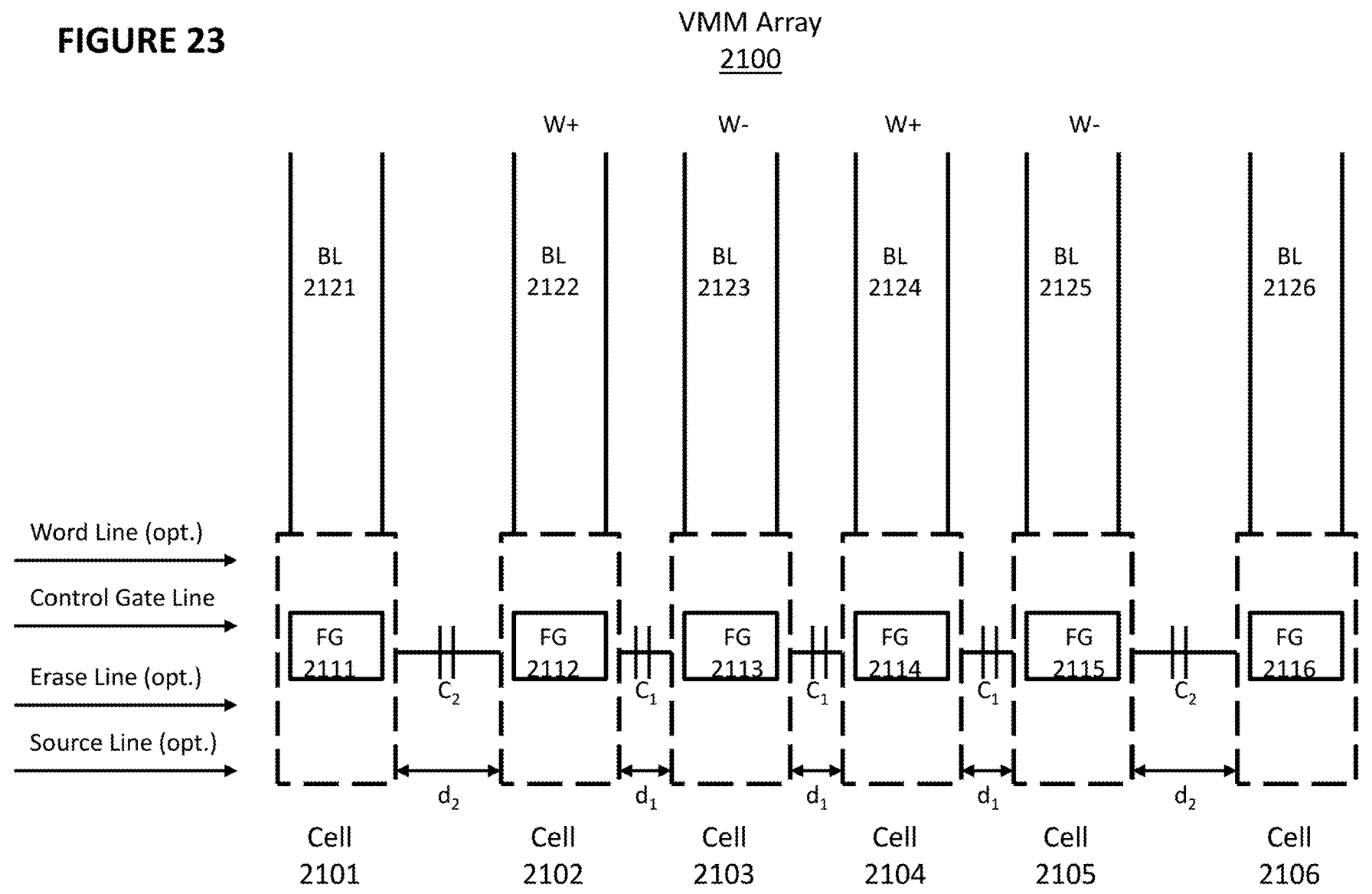

VMM Array
2100

Cell 2101 — BL 2121 — FG 2111

Cell 2102 — W+ — BL 2122 — FG 2112

$C_2$ — $d_2$

Cell 2103 — W- — BL 2123 — FG 2113

$C_1$ — $d_1$

Cell 2104 — W+ — BL 2124 — FG 2114

$C_1$ — $d_1$

Cell 2105 — W- — BL 2125 — FG 2115

$C_1$ — $d_1$

Cell 2106 — BL 2126 — FG 2116

$C_2$ — $d_2$

Word Line (opt.)

Control Gate Line

Erase Line (opt.)

Source Line (opt.)

Floating Gate Voltage v. Programming Pulse Count
for Ultra-Precision Programming Method

FIGURE 26

Ultra-Precision
Programming Method
2600

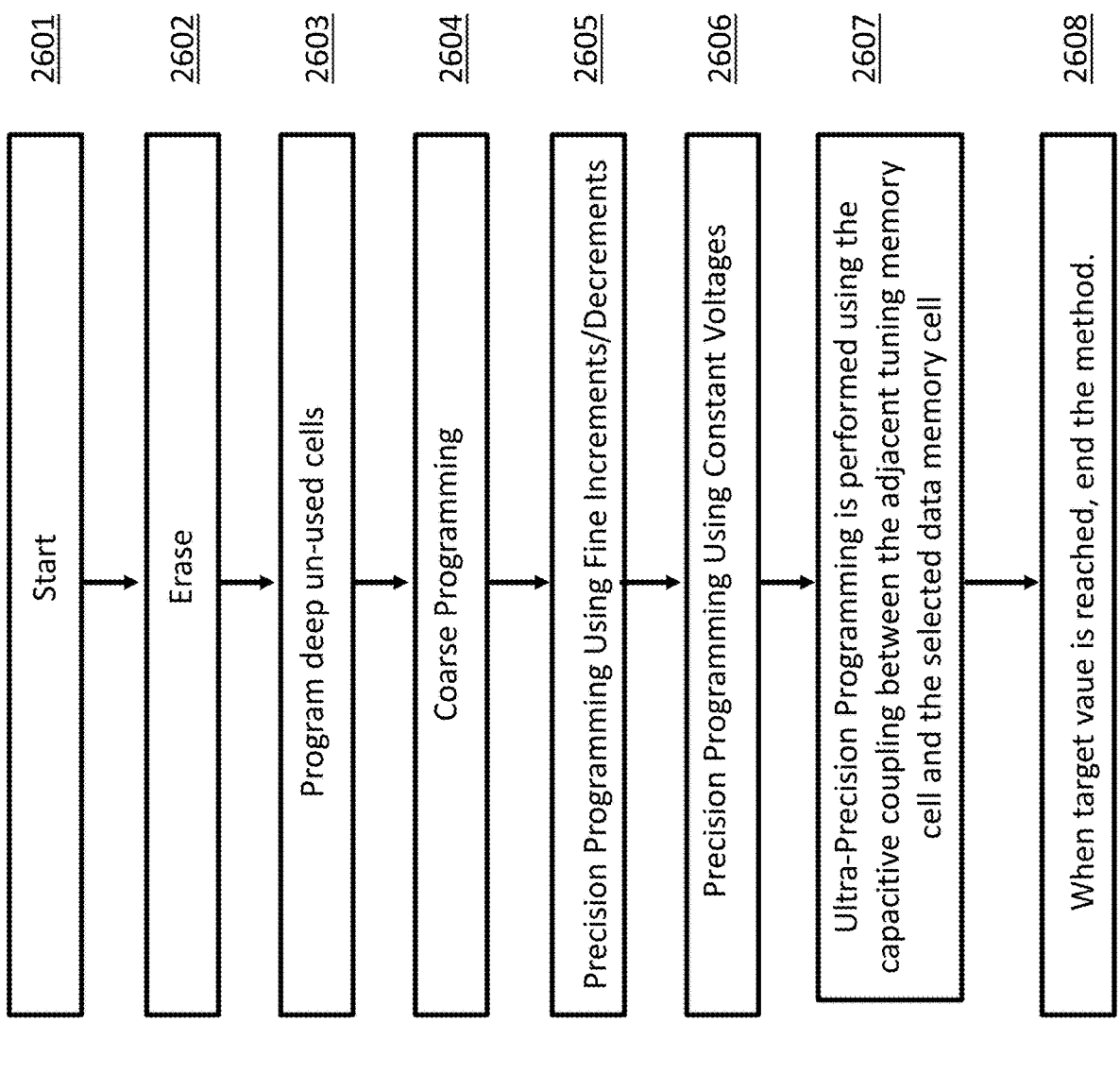

2601 — Start

2602 — Erase

2603 — Program deep un-used cells

2604 — Coarse Programming

2605 — Precision Programming Using Fine Increments/Decrements

2606 — Precision Programming Using Constant Voltages

2607 — Ultra-Precision Programming is performed using the capacitive coupling between the adjacent tuning memory cell and the selected data memory cell 2608 — When target vaue is reached, end the method.

Ultra-Precision
Programming Method
2700

FIGURE 28

Floating Gate Voltage v. Programming Pulse Count
For Ultra- Precision Programming Method

ULTRA-PRECISE TUNING OF NEURAL MEMORY CELLS

PRIORITY CLAIM

This application is a divisional application of U.S. patent application Ser. No. 16/985,147, filed on Aug. 4, 2020, and titled, "Ultra-Precise Tuning of Analog Neural Memory Cells in a Deep Learning Artificial Neural Network," which claims priority to U.S. Provisional Patent Application No. 62/981,757, filed on Feb. 26, 2020, and titled, "Ultra-Precise Tuning of Analog Neural Memory Cells in a Deep Learning Artificial Neural Network," which are incorporated by reference herein.

FIELD OF THE INVENTION

Examples for ultra-precise tuning of selected non-volatile memory cells in an analog neural memory are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

Figure 1:
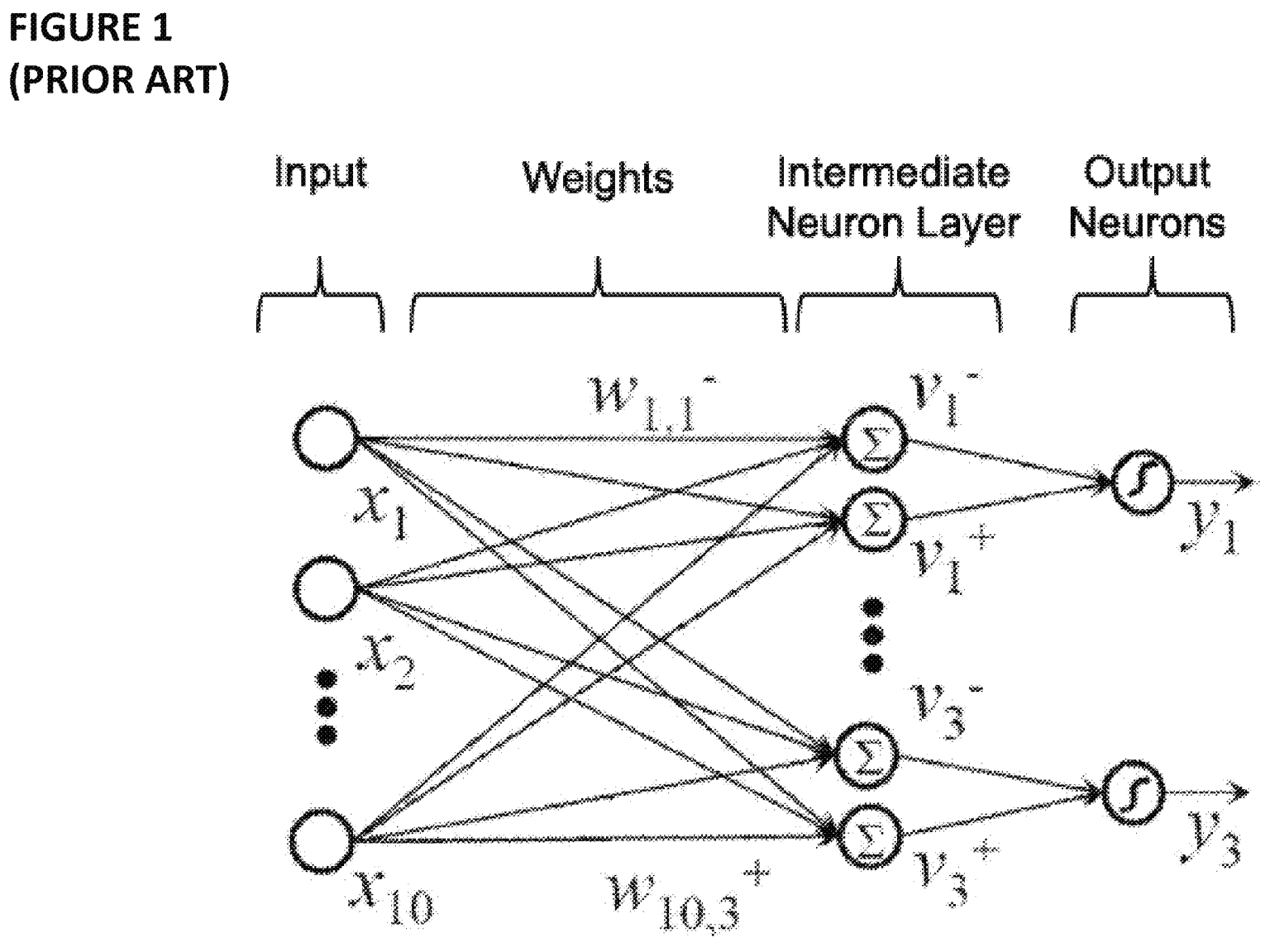

FIG. 1 illustrates an artificial neural network, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

| Operation of Flash Memory Cell 210 of FIG. 2 | | | |
| --- | --- | --- | --- |
| | WL | BL | SL |
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0v/−8V, low or mid range in read, e.g., 0v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

| Operation of Flash Memory Cell 410 of FIG. 4 | | | | | |
| --- | --- | --- | --- | --- | --- |
| | WL/SG | BL | CG | EG | SL |
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 µA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

| Operation of Flash Memory Cell 610 of FIG. 6 | | | | |
| --- | --- | --- | --- | --- |
| | WL/SG | BL | EG | SL |
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 µA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

| Operation of Flash Memory Cell 710 of FIG. 7 | | | | |
| --- | --- | --- | --- | --- |
| | CG | BL | SL | Substrate |
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Twin split-gate memory cell 810 comprises a pair of memory cells (A on the left and B on the right), wherein each of the memory cells comprise a floating gate (FGA, FGB) 20 disposed over and insulated from the substrate 12, a control gate 28 (CGA, CGB) disposed over and insulated from the floating gate 20, an erase gate 30 (EG) disposed adjacent to and insulated from the floating and control gates 20/28 and disposed over and insulated from the substrate 12, where the erase gate is created with a T shape such that a top corner of each control gate CGA, CGB faces the respective inside corner of the T shaped erase gate to improve erase efficiency, and a drain region 16 (DRA, DRB) in the substrate adjacent the floating gate 20 (with a bit line contact 24 (BLA, BLB)

connected to the respective drain diffusion regions 16 (DRA, DRB). The memory cells are formed as pairs of memory cells sharing a common erase gate 30. This cell design differs from that the memory cells discussed above with reference to FIGS. 2-7 at least in that it lacks a source region under the erase gate EG, lacks a select gate (also referred to as a word line), and lacks a channel region for each memory cell. Instead, a single continuous channel region 18 extends under both memory cells (i.e. extends from the drain region 16 of one memory cell to the drain region 16 of the other memory cell). To read or program one memory cell, the control gate 28 of the other memory cell is raised to a sufficient voltage to turn on the underlying channel region portion via voltage coupling to the floating gate 20 there between (e.g. to read or program cell A, the voltage on FGB is raised via voltage coupling from CGB to turn on the channel region portion under FGB). Erasing is performed using Fowler Nordheim electron tunneling from floating gate 20A and/or floating gate 20B to erase gate 30. Programming is performed using hot electron injection from channel 18 to floating gate 20A or 20B.

Table No. 5 depicts typical voltage ranges that can be applied to the terminals of memory cell 810 for performing read, erase, and program operations. Cell A (FG, CGA, BLA) is selected for read, program, and erase operation

TABLE NO. 5

| Operation of Flash Memory Cell 810 of FIG. 8 | | | | | |
|---|---|---|---|---|---|
| | CGA | BLA | EG | CGB | BLB |
| READ | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 8 V | 0 V | −4 V to −8 V | 0 V to −2 V (Vcginhp) | 0 V |

In order to utilize the memory arrays comprising one of the types of non-volatile memory cells described above in an artificial neural network, in one embodiment, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, or from a fully erased state to a fully programmed state, independently and with minimal disturbance of other memory cells. This means the cell storage is analog or at the very least can store one of many discrete values (such as 16 or 256 different values), which allows for very precise and individual tuning (meaning programming or erasing the cell to a target value) of all the cells in the memory array, and which makes the memory array ideal for storing and making finely tuned synapsis weights of the neural network.

The methods and means described herein may apply to other non-volatile memory technologies such as FINFET split gate flash or stack gate flash, SONOS (silicon-oxidenitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for VMM array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

Non-volatile memory cell array 33 serves two purposes. First, it stores the weights that will be used by the VMM system 32. Second, non-volatile memory cell array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Each non-volatile memory cell used in the VMM array must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256. One challenge is the ability to program selected cells with the precision and granularity required for different values of N. For example, if a selected cell can include one of 128 different values, extreme precision is required in program operations.

What is needed are improved programming systems and methods suitable for use with a VMM array in an analog neuromorphic memory.

SUMMARY OF THE INVENTION

Embodiments for ultra-precise tuning of a selected memory cell are disclosed. The selected memory cell optionally is first programmed using coarse programming and fine programming methods. The selected memory cell then undergoes ultra-precise (ultra fine) programming through the programming of an adjacent memory cell. As the adjacent memory cell is programmed, capacitive coupling between the floating gate of the adjacent memory cell and the floating gate of the selected memory cell will cause the voltage of the floating gate of the selected memory cell to increase, but in smaller increments than could be achieved by programming the selected memory cell directly. In this manner, the selected memory cell can be programmed with ultra-precise gradations in a manner that corresponds to a sub-single electron precision (fractional electron precision) being added per programming pulse to the floating gate of the selected memory cell.

In one embodiment, a method of programming a selected memory cell in a neural memory to a target value is disclosed, comprising: programming a floating gate of the selected memory cell to a first voltage by applying a first sequence of voltages to terminals of the selected memory cell; and programming the floating gate of the selected memory cell to a second voltage through capacitive coupling between the floating gate of the selected memory cell and a floating gate of an adjacent tuning cell by applying a second sequence of voltages to terminals of the adjacent tuning cell, wherein the second voltage corresponds to the target value.

BRIEF DESCRIPTION OF THE DRAWINGS

FIG. 1 depicts a prior art artificial neural network.

FIG. 14 depicts an embodiment of a coarse programming method.
FIG. 17 depicts a calibration algorithm for the programming of a non-volatile memory cell that adjusts the programming parameters based on slope characteristics of the cell.
FIG. 18 depicts a calibration algorithm for the programming of a non-volatile memory cell.
FIG. 19 depicts a calibration algorithm for the programming of a non-volatile memory cell.
FIG. 23 depicts a VMM array that is capable of ultra-precise programming, where certain columns contain positive values (W+) and certain columns contain negative values (W−).
FIG. 26 depicts an ultra-precise programming method.
FIG. 28 depicts the floating gate voltage of a selected memory cell and an adjacent tuning cell during a sequence of programming pulses

DETAILED DESCRIPTION OF THE INVENTION

Figure 12:
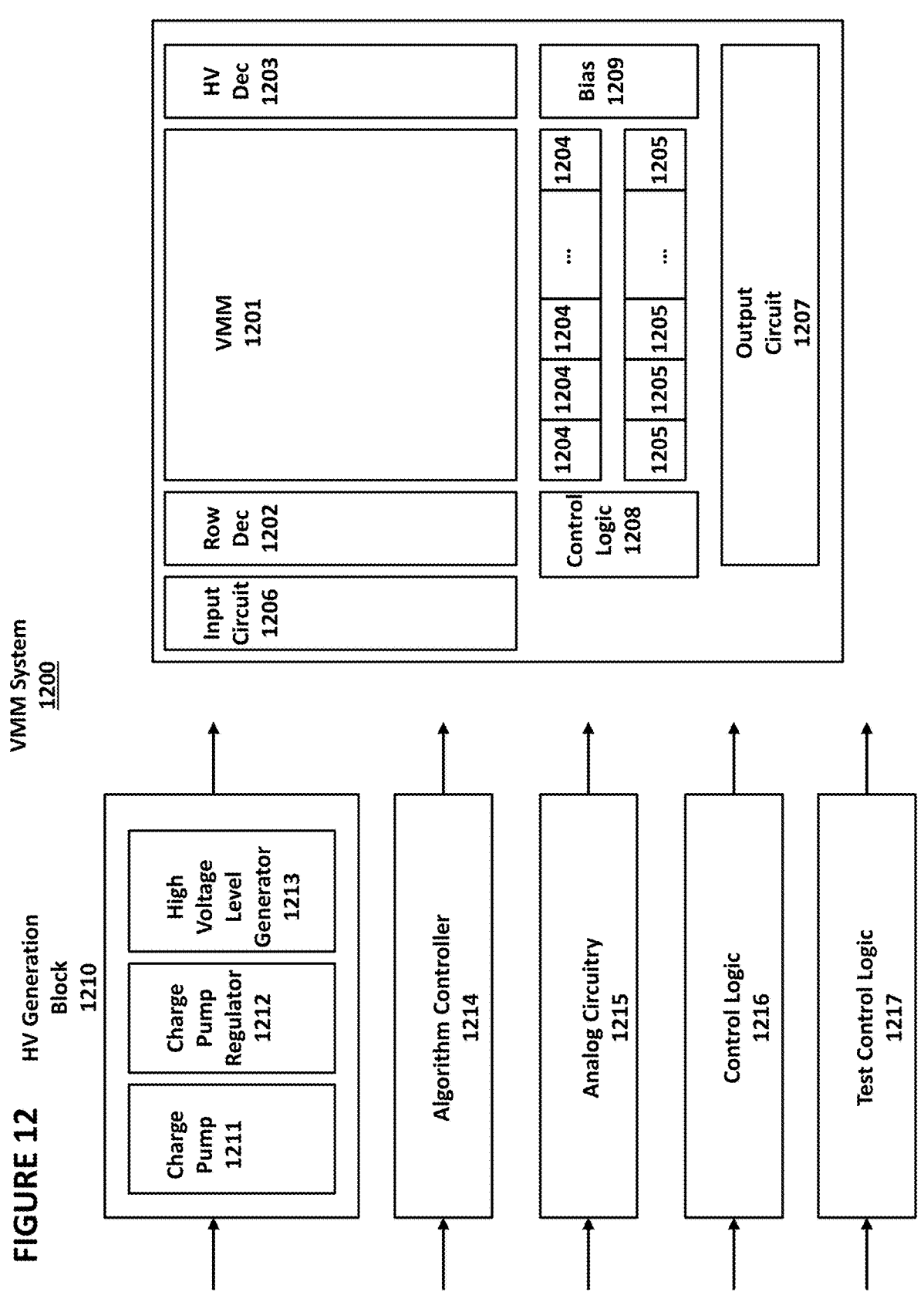
FIG. 12 depicts an embodiment of a VMM system.

FIG. 12 depicts a block diagram of VMM system 1200. VMM system 1200 comprises VMM array 1201, row decoders 1202, high voltage decoders 1203, column decoders 1204, bit line drivers 1205, input circuit 1206, output circuit 1207, control logic 1208, and bias generator 1209. VMM system 1200 further comprises high voltage generation block 1210, which comprises charge pump 1211, charge pump regulator 1212, and high voltage level generator 1213. VMM system 1200 further comprises algorithm controller 1214, analog circuitry 1215, control logic 1216, and test control logic 1217. The systems and methods described below can be implemented in VMM system 1200.

Various levels of precision can be achieved during the programming process using coarse programming, precision programming, and ultra-precision programming.

As described herein for neural networks, the non-volatile memory cells of VMM array 1200, i.e. the flash memory of VMM array 1200, are preferably configured to operate in a sub-threshold region.

The non-volatile reference memory cells and the non-volatile memory cells described herein are biased in sub-threshold region:

$$Ids = Io * e^{(Vg-Vth)/nVt} = w * Io * e^{(Vg)/nVt},$$

where $w = e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Jo is the memory cell current at gate voltage equal to threshold voltage, Jo is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg = n * Vt * \log[Ids/wp * Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg = n * Vt * \log[Ids/wp * Io]$$

Here, wp is w of a reference or peripheral memory cell.

For a memory array used as a vector matrix multiplier VMM array, the output current is:

$$Iout = wa * Io * e^{(Vg)/nVt}, \text{ namely}$$

$$Iout = (wa/wp) * Iin = W * Iin$$

$$W = e^{(Vthp-Vtha)/nVt}$$

$$Iin = wp * Io * e^{(Vg)/nVt}$$

Here, wa=w of each memory cell in the memory array.

A wordline or control gate can be used as the input for the memory cell for the input voltage.

Alternatively, the non-volatile memory cells of VMM arrays described herein can be configured to operate in the linear region:

$$Ids = beta * (Vgs-Vth) * Vds; \ beta = u * Cox * Wt/L,$$

$$W \alpha (Vgs-Vth),$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = {}^{1/2} * beta * (Vgs-Vth)^2; \ beta = u * Cox * Wt/L$$

$$W \alpha (Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Embodiments for Coarse Programming and Precision Programming of Cells in a VMM

Figure 13A:
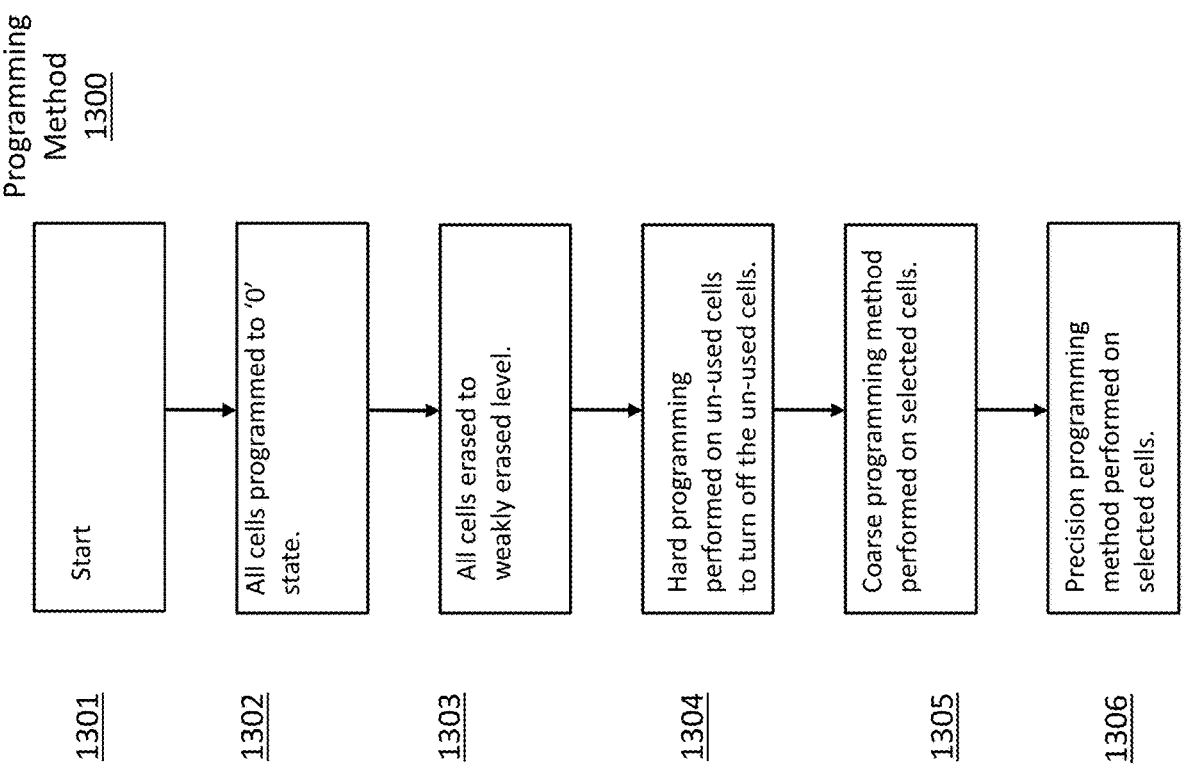
FIG. 13A depicts an embodiment of a method of programming a non-volatile memory cell.

FIG. 13A depicts programming method 1300 that utilizes coarse programming and precision programming. First, the method starts (step 1301), which typically occurs in response to a program command being received. Next, a mass program operation programs all cells to a '0' state (step 1302). Then a soft erase operation erases all cells to an intermediate weakly erased level such that each cell would draw current of, for example, approximately 3-5 μA during a read operation (step 1303). This is in contrast to a deeply erased level where each cell would draw current of approximately ~20-30 μA during a read operation. Then, a hard program is performed on all un-used cells to a very deep programmed state to add electrons to the floating gates of the cells (step 1304) to ensure that those cells are really "off," meaning that those cells will draw a negligible amount of current during a read operation.

A coarse programming method (to get the cell much closer to the target, for example 1.2×-100× the target) is then performed on the selected cells (step 1305), followed by a precision programming method on the selected cells (step 1306) to program the precise value desired for each selected cell.

Figure 13B:
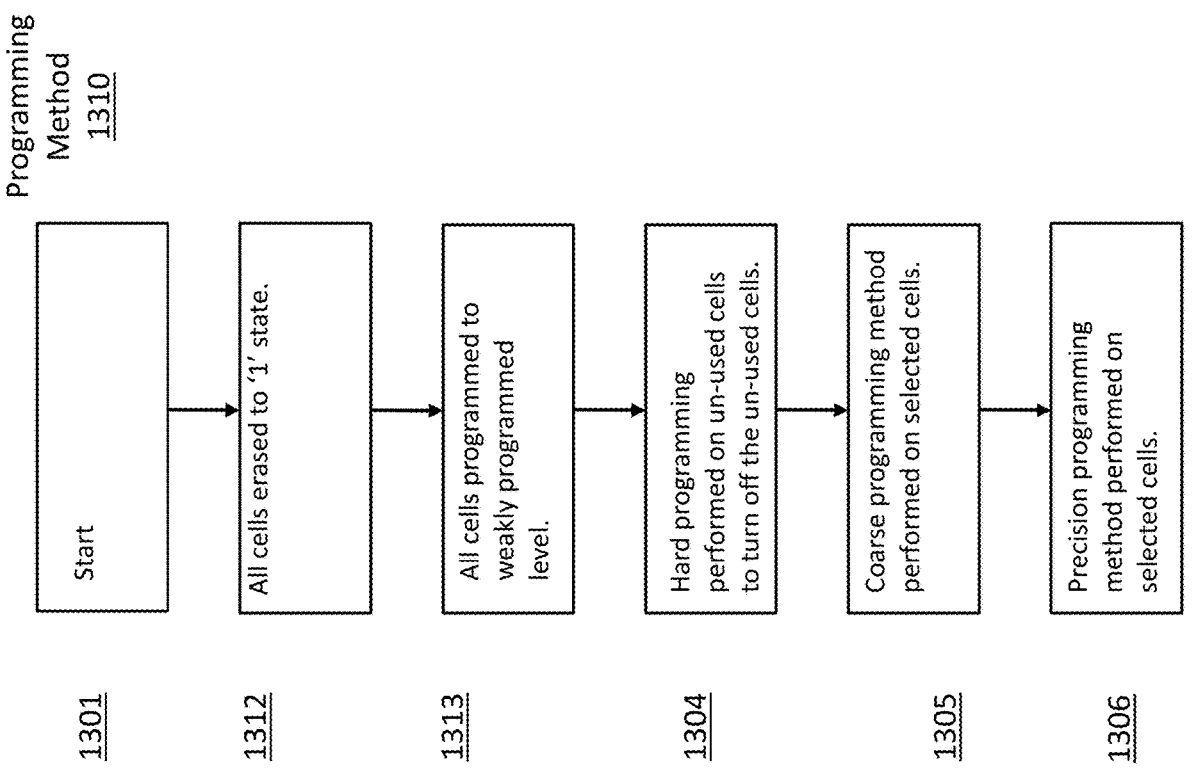
FIG. 13B depicts another embodiment of a method of programming a non-volatile memory cell.

FIG. 13B depicts another programming method 1310, which is similar to programming method 1300 and also utilizes coarse programming and precision programming. However, instead of a program operation to program all cells to a '0' state as in step 1302 of FIG. 13A, after the method start (step 1301), an erase operation is used to erase all cells to a '1' state (step 3312). Then a soft (weakly) program operation (step 1313) is used to program all cells to an intermediate state (level) such that each cell would draw current of approximately 0.2-5 μA (e.g., 2×-100× the target) during a read operation. Afterward, coarse and precision programming method would follow as in FIG. 13A. A variation of the embodiment of FIG. 13B would remove the soft programing method (step 1313) altogether.

FIG. 14 depicts a first embodiment of coarse programming method 1305, which is search and execute method 1400. First, a lookup table or a function search is performed to determine a coarse target current value $(I_{CT})$ for the selected cell based on the value that is intended to be stored in that selected cell (step 1401). This table or function is, for example, created by silicon characterization or from calibration from wafer testing. It is assumed that the selected cell can be programmed to store one of N possible values (e.g., 128, 64, 32, without limitation). Each of the N values would correspond to a different desired current value $(I_D)$ that is drawn by the selected cell during a read operation. In one embodiment, a look-up table might contain M possible current values to use as the coarse target current value $I_{CT}$ for the selected cell during search and execute method 1400, where M is an integer less than N. For example, if N is 8, then M might be 4, meaning that there are 8 possible values that the selected cell can store, and one of 4 coarse target current values will be selected as the coarse target for search and execute method 1400. That is, search and execute method 1400 (which again is an embodiment of coarse programming method 1305) is intended to quickly program the selected cell to a coarse target current value ($I_{CT}$) that is somewhat close to the desired current value ($I_D$), and then the precision programming method 1306 is intended to more precisely program the selected cell to be extremely close to the desired current value ($I_D$).

Examples of cell values, desired current values, and coarse target current values are depicted in Tables 9 and 10 for the simple example of N=8 and M=4:

TABLE NO. 9

| Example of N Desired Current Values for N = 8 | |
|---|---|
| Value Stored in Selected Cell | Desired Current Value ($I_D$) |
| 000 | 100 pA |
| 001 | 200 pA |
| 010 | 300 pA |
| 011 | 400 pA |
| 100 | 500 pA |
| 101 | 600 pA |
| 110 | 700 pA |
| 111 | 800 pA |

TABLE NO. 10

| Example of M Target Current Values for M = 4 | |
|---|---|
| Coarse Target Current Value ($I_{CT}$) | Associated Cell Values |
| 800 pA + $I_{CTOFFSET1}$ | 000, 001 |
| 1600 pA + $I_{CTOFFSET2}$ | 010, 011 |
| 2400 pA + $I_{CTOFFSET3}$ | 100, 101 |
| 3200 pA + $I_{CTOFFSET4}$ | 110, 111 |

Figures 2, 3:
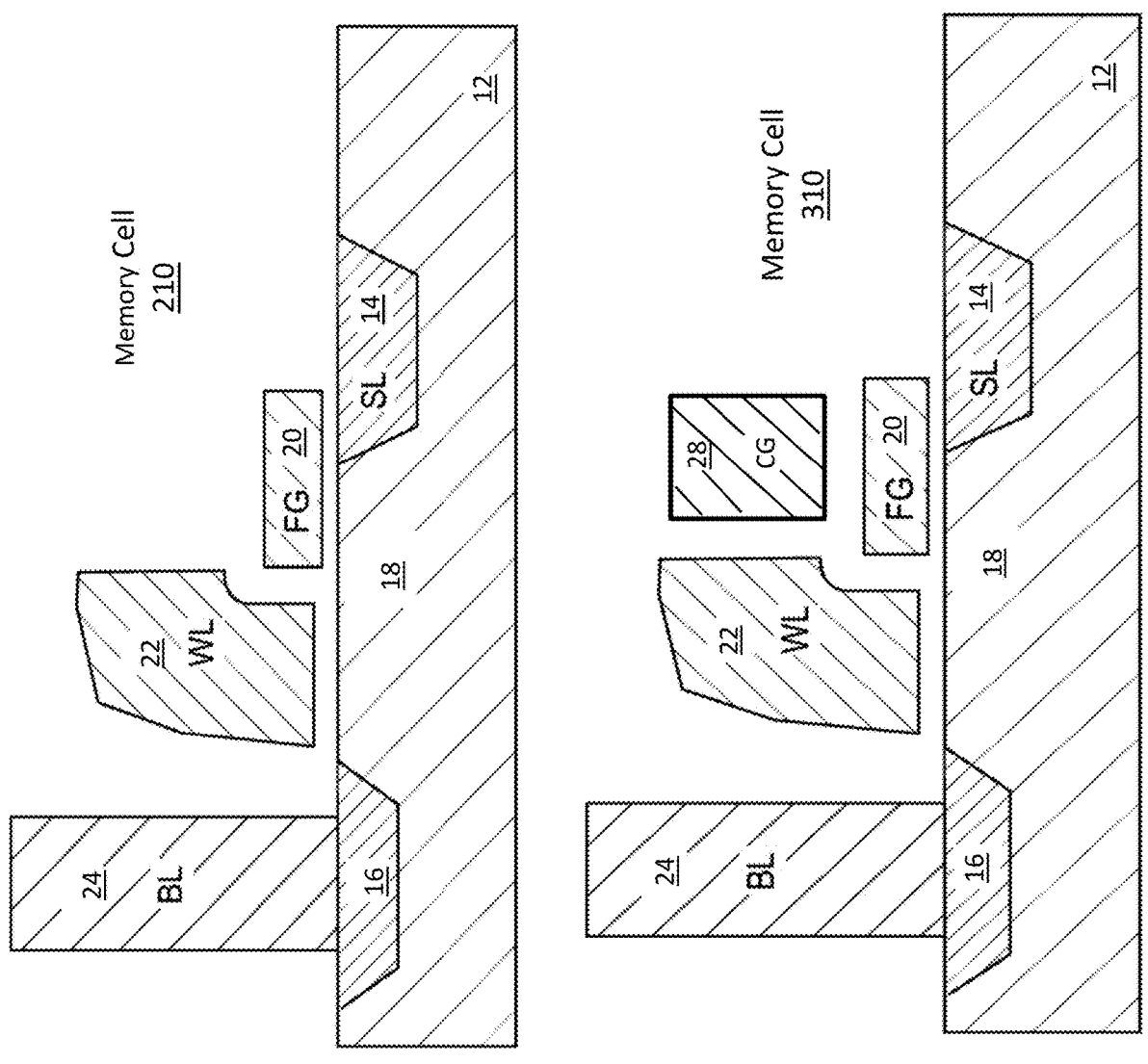
FIG. 2 depicts a prior art split gate flash memory cell.
FIG. 3 depicts another prior art split gate flash memory cell
Figures 4, 5:
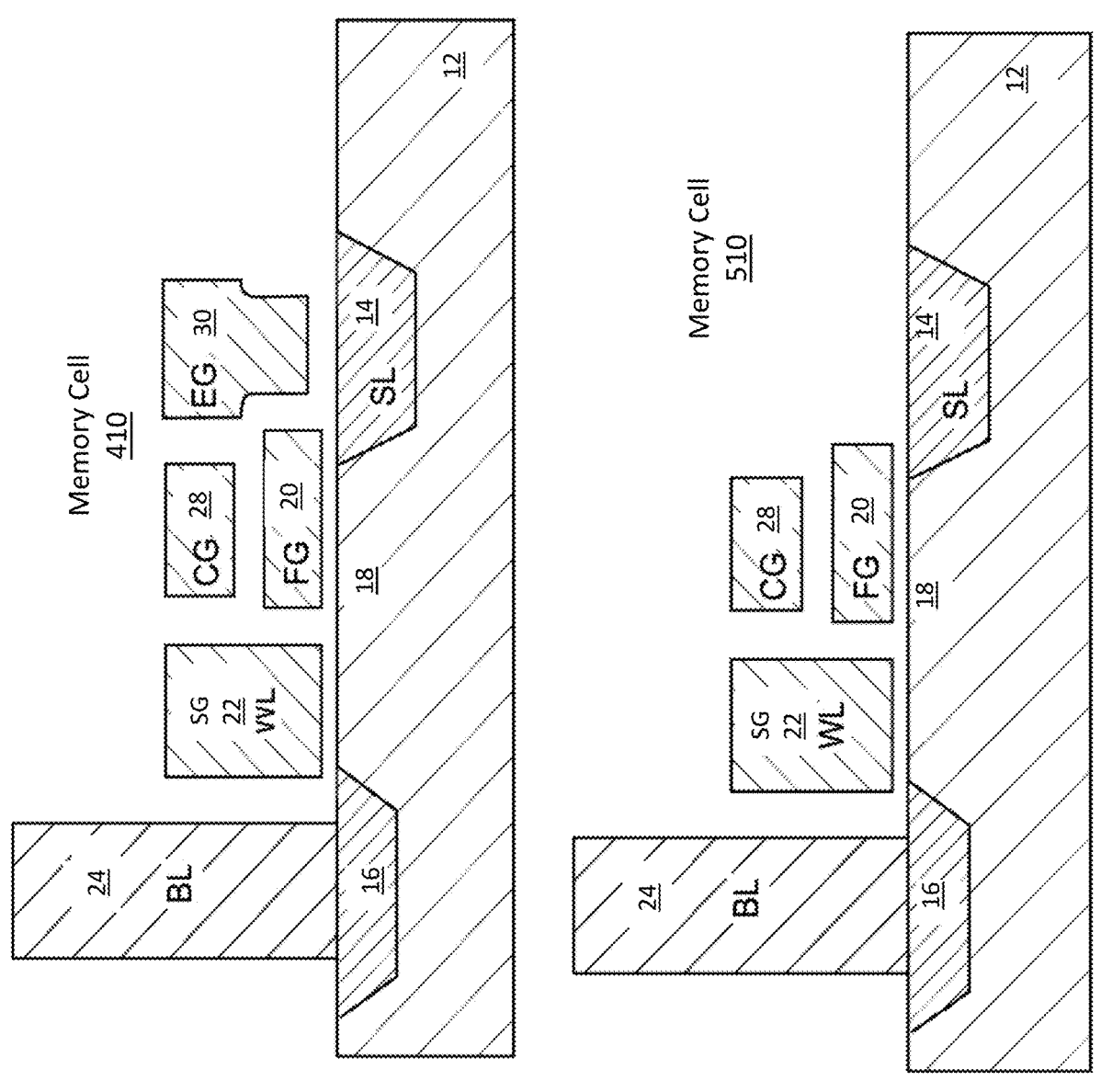
FIG. 4 depicts another prior art split gate flash memory cell.
FIG. 5 depicts another prior art split gate flash memory cell
Figures 6, 7:
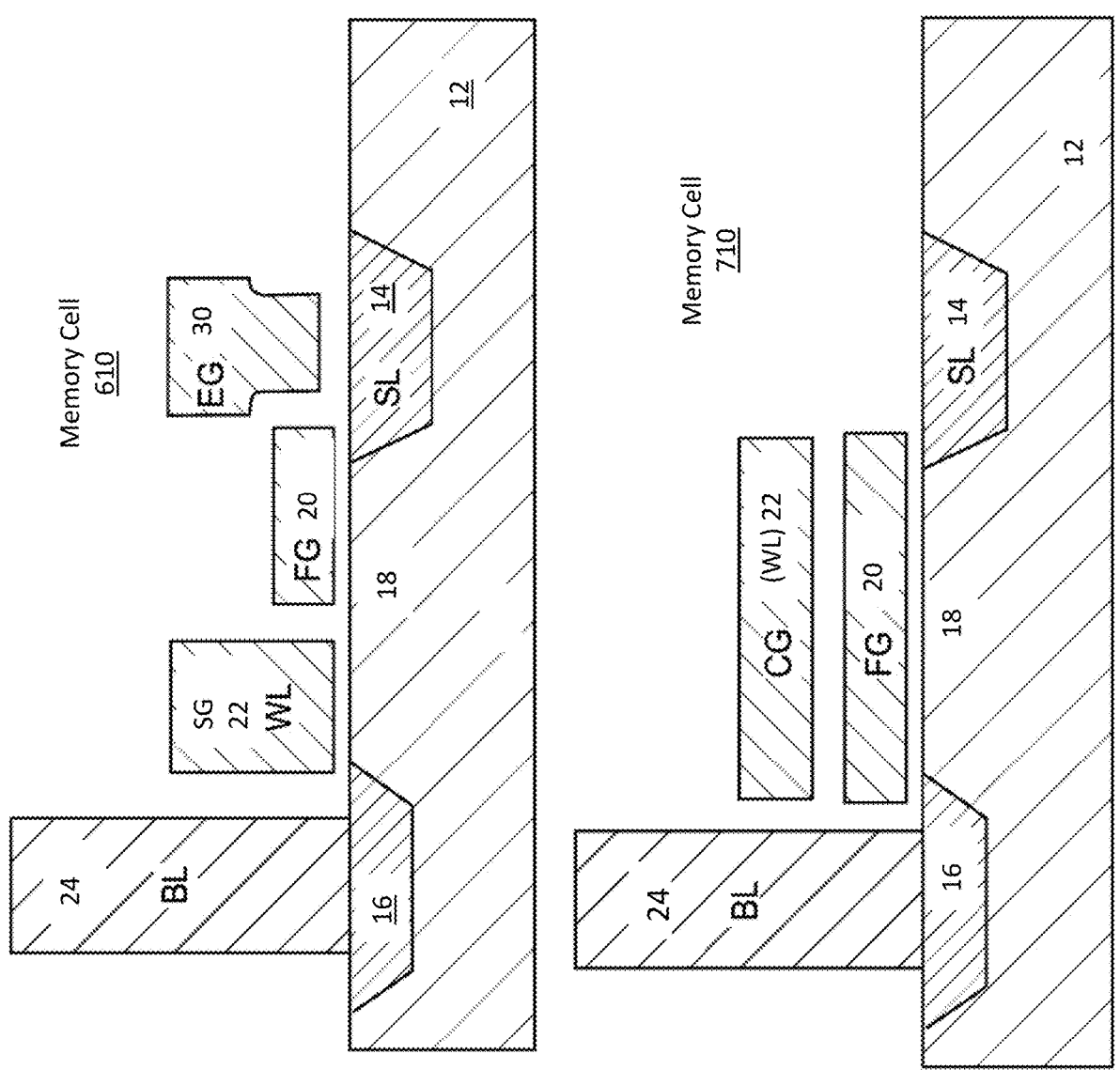
FIG. 6 depicts another prior art split gate flash memory cell.
FIG. 7 depicts a prior art stacked gate flash memory cell.
Figure 8:
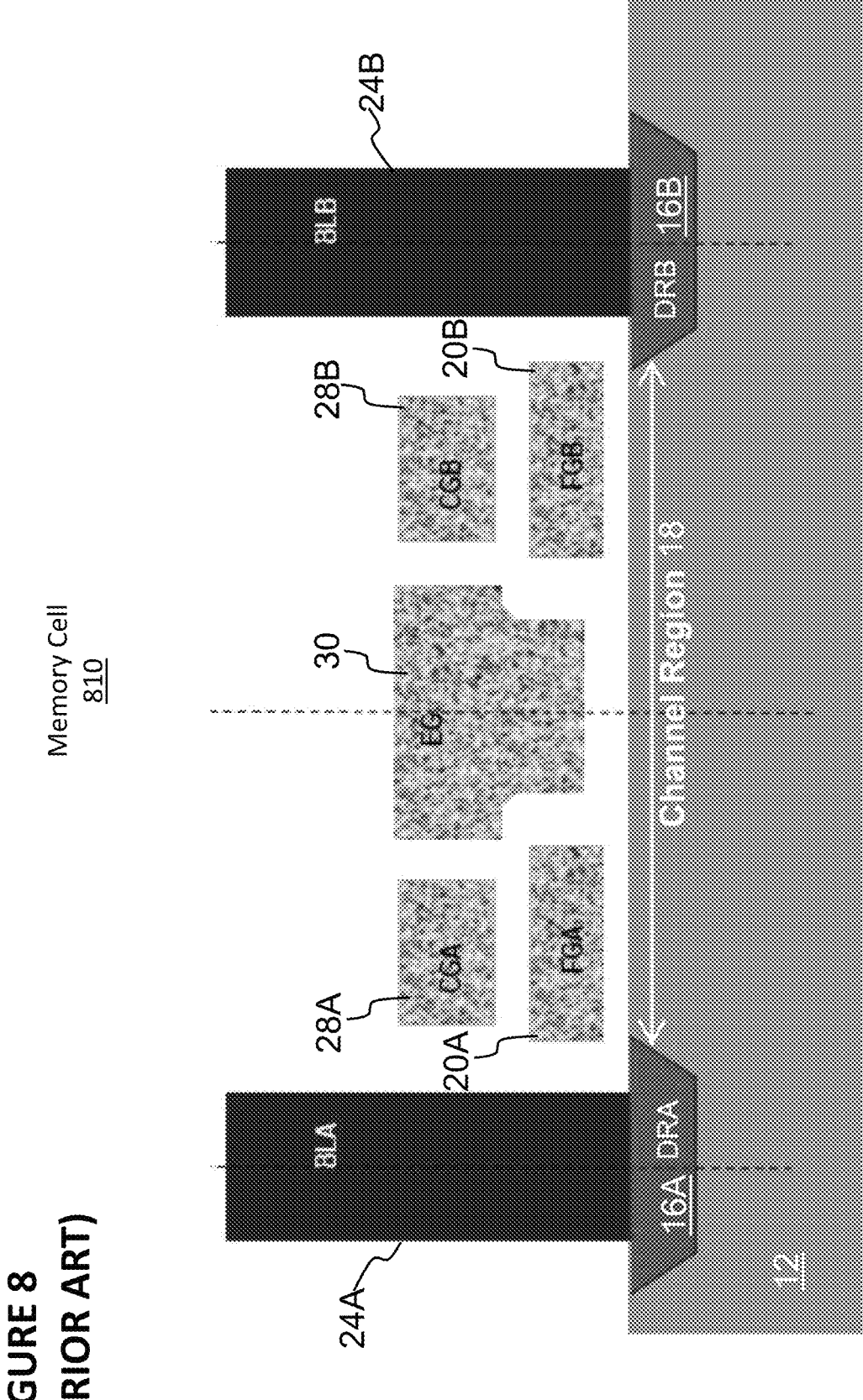
FIG. 8 depicts a prior art twin split gate flash memory cell.
Figure 9:
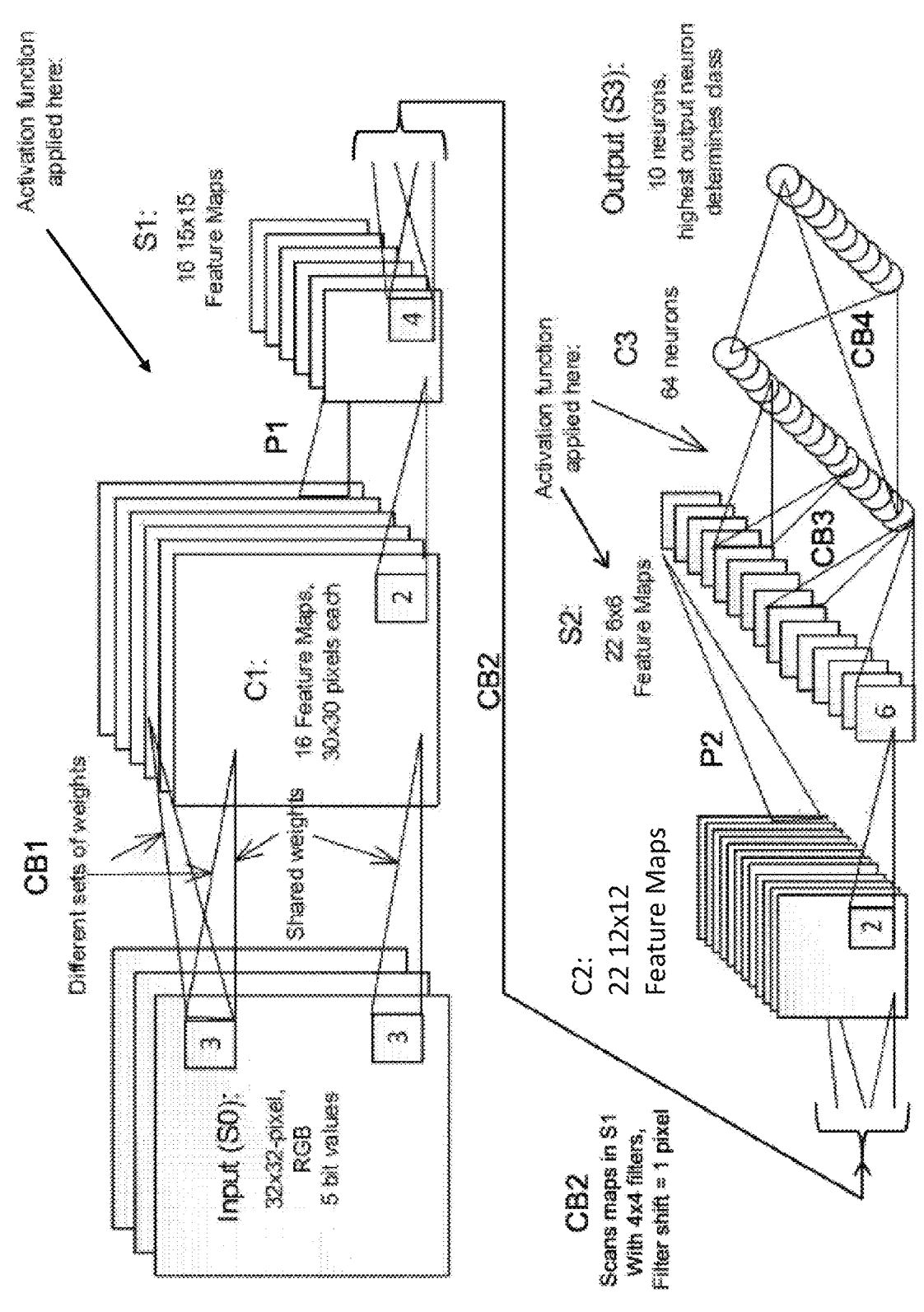
FIG. 9 depicts the different levels of an exemplary artificial neural network utilizing one or more non-volatile memory arrays.
Figure 10:
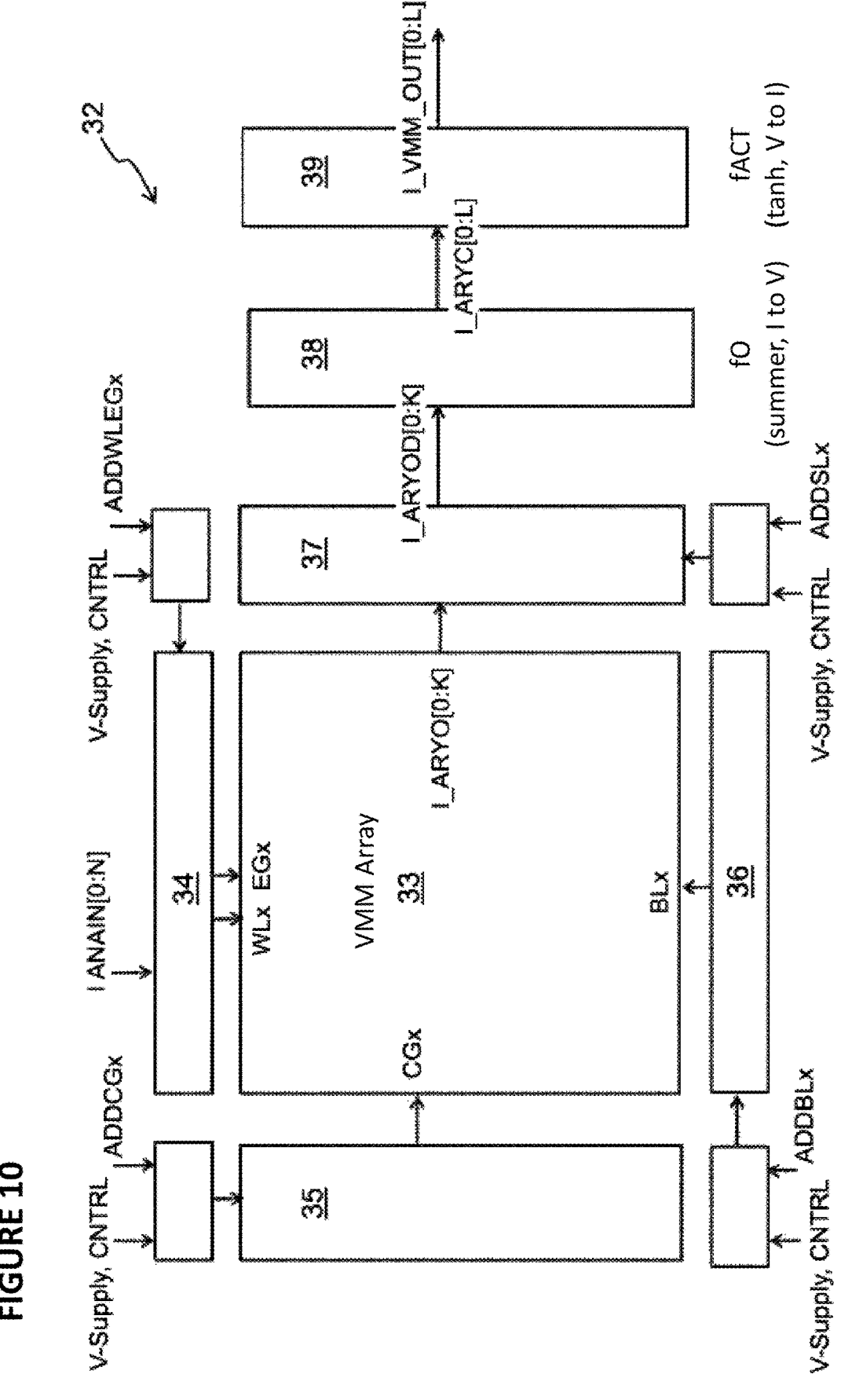
FIG. 10 depicts a vector-by-matrix multiplication system.
Figure 11:
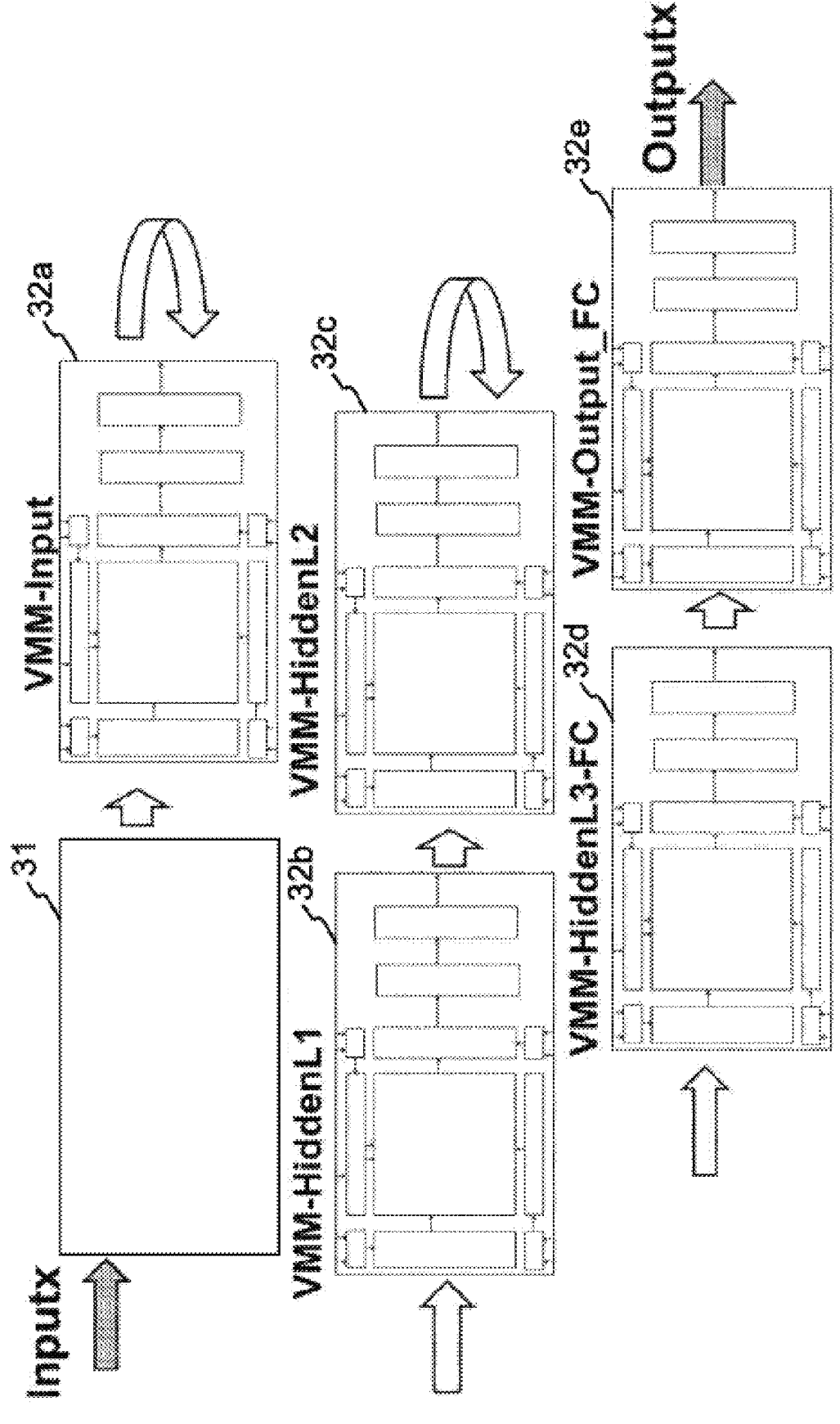
FIG. 11 depicts an exemplary artificial neural network utilizing one or more a vector-by-matrix multiplication systems.

The offset values $I_{CTOFFSETx}$ are used to prevent overshooting the desired current value during coarse tuning Once the coarse target current value $I_{CT}$ is selected, the selected cell is programmed by applying the voltage $v_0$ to the appropriate terminal of selected cell based on the cell architecture type of the selected cell (e.g., memory cells 210, 310, 410, or 510) (step 1402). If the selected cell is of type memory cell 310 in FIG. 3, then the voltage $v_0$ will be applied to control gate terminal 28 (and/or source line 14), and $v_0$ might be for example 5-8V depending on coarse target current value $I_{CT}$. The value of $v_0$ optionally can be determined from a voltage look up table that stores $v_0$ vs. coarse target current value $I_{CT}$.

Next, the selected cell is programmed by applying the voltage $v_i = v_{i-1} + v_{increment}$, where i starts at 1 and increments each time this step is repeated, and where $v_{increment}$ is a small, fine voltage that will cause a degree of programming that is appropriate for the granularity of change desired (step 1403). Thus, the first time step 1403 is performed, i=1, and $v_1$ will be $v_0 + v_{increment}$. Then a verify operation occurs (step 1404), wherein a read operation is performed on the selected cell and the current drawn through the selected cell ($I_{cell}$) is measured. If $I_{cell}$ is less than or equal to $I_{CT}$ (which here is a first threshold value), then search and execute method 1400 is complete and precision programming method 1306 can begin. If $I_{cell}$ is not less than or equal to coarse target current value $I_{CT}$, then step 1403 is repeated, and i is incremented.

Thus, at the point when coarse programming method 1305 ends and precision programming method 1306 begins, the voltage $v_i$ will be the last voltage used to program the selected cell, and the selected cell will be storing a value associated with the coarse target current value $I_{CT}$. The goal of precision programming method 1306 is to program the selected cell to the point where during a read operation it draws a current $I_D$ (plus or minus an acceptable amount of deviation, such as +/−50 pA or +/−30% or less), which is the desired current value that is associated with the value that is intended to be stored in the selected cell.

Figure 15:
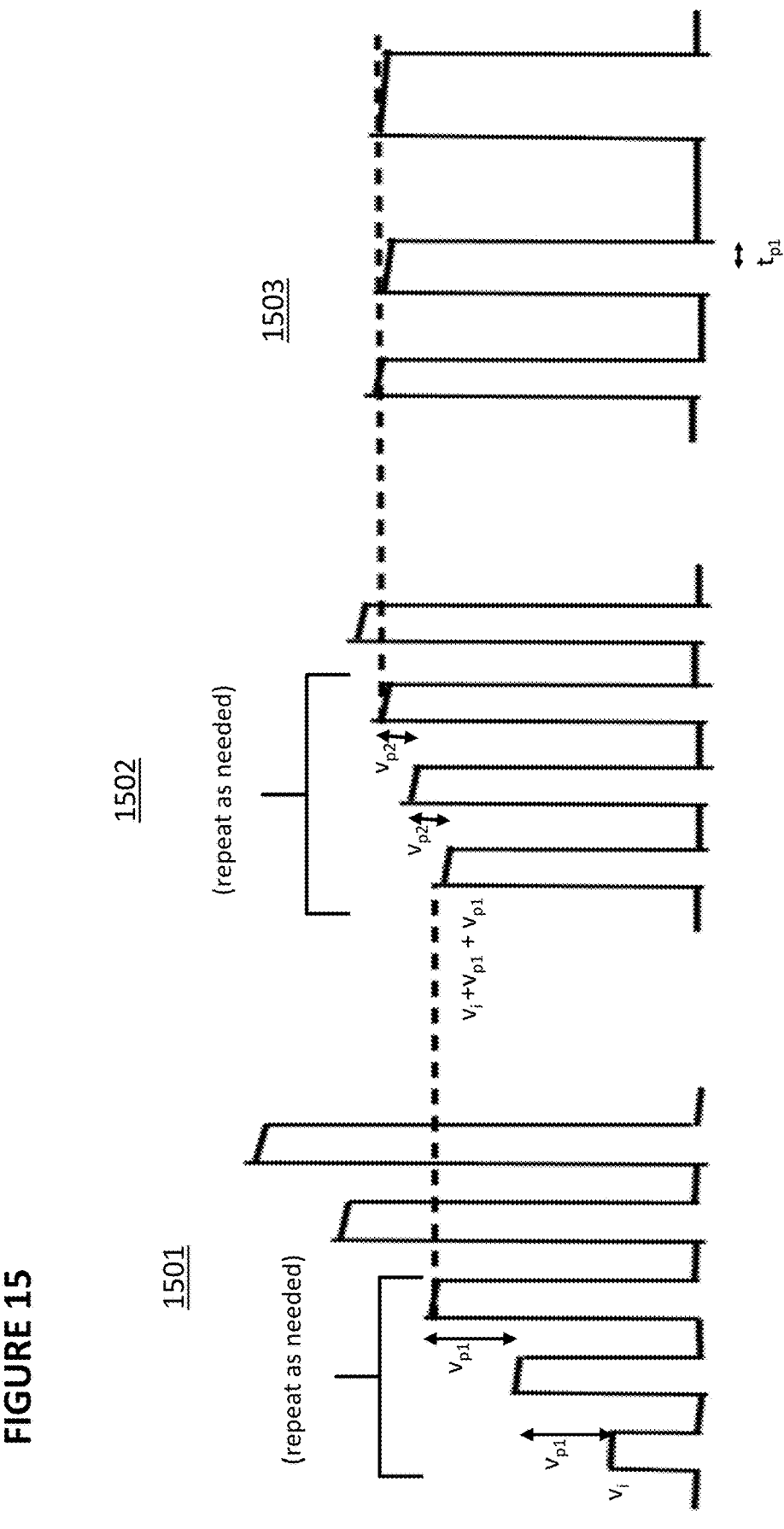
FIG. 15 depicts exemplary pulses used in the programming of a non-volatile memory cell.

FIG. 15 depicts examples of different voltage progressions that can be applied to the control gate of a selected memory cell during coarse programming method 1305 and/or precision program method 1306.

Under a first approach, increasing voltages are applied in progression to the control gate to further program the selected memory cell. The starting point is $v_i$, which is approximately around the last voltage (+ or − some delta voltage as desired or depending on target current) applied during coarse programming method 1305. An increment of $v_{p1}$ is added to $v_i$ and the voltage $v_n + v_{p1}$ is then used to program the selected cell (indicated by the second pulse from the left in progression 1501). $v_{p1}$ is an increment that is smaller than $v_{increment}$ (the voltage increment used during coarse programming method 1305). After each programming voltage is applied, a verify step (similar to step 1404) is performed, where a determination is made if $I_{cell}$ is less than or equal to $I_{PT1}$ (which is the first precision target current value and here is a second threshold value), where $I_{PT1} = I_D + I_{PT1OFFSET}$, where $I_{PT1OFFSET}$ is an offset valued added to prevent program overshoot. If it is not, then another increment $v_{p1}$ is added to the previously-applied programming voltage, and the process is repeated. At the point where $I_{cell}$ is less than or equal to $I_{PT1}$, then this portion of the programming sequence stops. Optionally, if $I_{PT1}$ is equal to $I_D$, or almost equal to $I_D$ with sufficient precision, then the selected memory cell has been successfully programmed.

If $I_{PT1}$ is not close enough to $I_D$, then further programming of a smaller granularity can occur. Here, progression 1502 is now used. The starting point for progression 1502 is approximately about the last voltage (+ or − some delta voltage as desired or depending on target current) used for programming under progression 1501. An increment of $V_{p2}$ (which is smaller than $v_{p1}$) is added to that voltage, and the combined voltage is applied to program the selected memory cell. After each programming voltage is applied, a verify step (similar to step 1404) is performed, where a determination is made if $I_{cell}$ is less than or equal to $I_{PT2}$ (which is the second precision target current value and here is a third threshold value), where $I_{PT2} = I_D + I_{PT2OFFSET}$, $I_{PT2OFFSET}$ is an offset value added to prevent program overshoot. Typically, IPT2OFFSET<IPT1OFFSET, since the programming steps become smaller and more precise with each round. If it is not, then another increment $V_{p2}$ is added to the previously-applied programming voltage, and the process is repeated. At the point where $I_{cell}$ is less than or equal to $I_{PT2}$, then this portion of the programming sequence stops. Here, it is assumed that $I_{PT2}$ is equal to $I_D$ or close enough to $I_D$ that the programming can stop, since the target value has been achieved with sufficient precision. One of ordinary skill in the art can appreciate that additional progressions can be applied with smaller and smaller programming increments used. For example, in FIG. 16, three progressions (1601, 1602, and 1603) are applied instead of just two.

Figure 16:
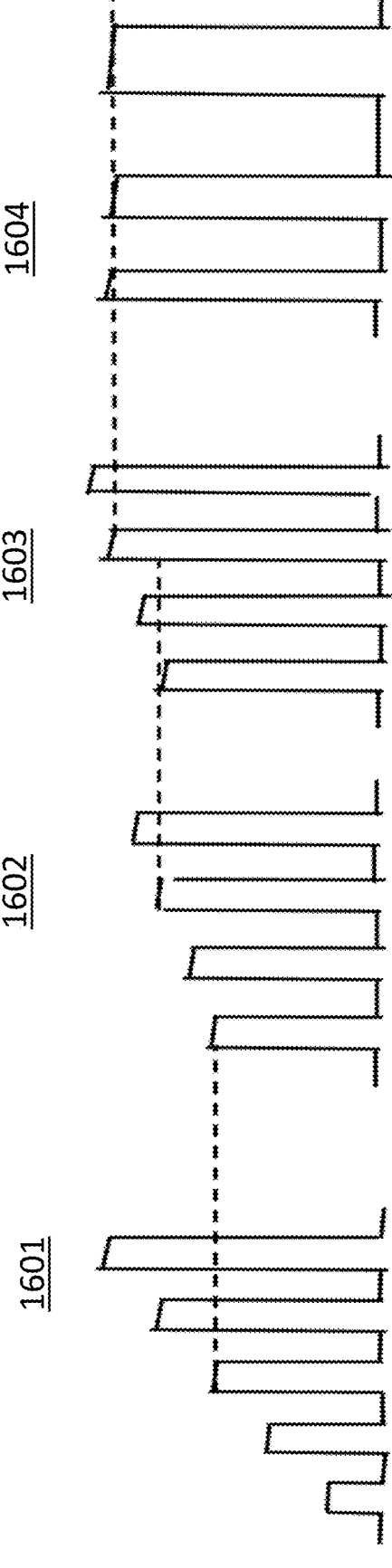
FIG. 16 depicts exemplary pulses used in the programming of a non-volatile memory cell.

A second approach is shown in progression 1503 in FIG. 15 and progression 1604 in FIG. 16. Here, instead of increasing the voltage applied during the programming of the selected memory cell, the same voltage is applied for durations of increasing period. Instead of adding an incremental voltage such as $v_{p1}$ in progression 1501 and $v_{p2}$ in progression 1503, an additional increment of time $t_{p1}$ is added to the programming pulse such that each applied pulse is longer than the previously-applied pulse by $t_{p1}$. After each programming pulse is applied, a verify step (similar to step 1404) is performed. Optionally, additional progressions can be applied where the additional increment of time added to the programming pulse is of a smaller duration than the previous progression used. Although only one temporal progression is shown, one of ordinary skill in the art will appreciate that any number of different temporal progressions can be applied.

Alternatively, the duration of each pulse can be the same for pulse progressions 1503 and 1603, and the system can rely on the number of pulses to perform additional programming.

Additional detail will now be provided for three additional embodiments of coarse programming method 1305.

FIG. 17 depicts a first embodiment of coarse programming method 1305, which is adaptive calibration method 1700. The method starts (step 1701). The cell is programmed at a default start value $v_0$ (step 1702). Unlike in search and execute method 1400, here $v_0$ is not derived from a lookup table, and instead can be a pre-determined relatively small initial value. The control gate voltage of the cell is measured at a first current value IR1 (e.g., 100 na) and a second current value IR2 (e.g., 10 na), and a sub-threshold slope is determined based on those measurements (e.g., 360 mV/dec) and stored (step 1703).

A new desired voltage, $v_i$, is determined. The first time this step is performed, i=1, and $v_1$ is determined based on the stored sub-threshold slope value and a current target and offset value using a sub-threshold equation, such as the following:

$$Vi = Vi-1 + Vincrement,$$

Where Vincrement is proportional to slope of Vg $$Vg = n*Vt*\log[Ids/wa*Io]$$

Here, wa is w of a memory cell, Ids is the current target plus offset value.

If the stored sub-threshold slope value is relatively steep, then a relatively small current offset value can be used. If the stored sub-threshold slope value is relatively flat, then a relatively high current offset value can be used. Thus, determining the sub-threshold slope value will allow for a current offset value to be selected that is customized for the particular cell in question. This ultimately will make the programming process shorter. When this step is repeated, i is incremented, and $v_i = v_{i-1} + v_{increment}$. The cell is then programmed using vi. $v_{increment}$ can be determined for example from a lookup table storing values of $v_{increment}$. vs. desired current value ($I_D$).

Next, a verify operation is performed, wherein a read operation is performed on the selected cell and the current drawn through the selected cell ($I_{cell}$) is measured (step 1705). If $I_{cell}$ is less than or equal to coarse target current value $I_{CT}$, where $I_{CT}$ is set=$I_D+I_{CTOFFSET}$, where $I_{CTOFFSET}$ is an offset value added to prevent program overshoot, then adaptive calibration method 1700 is complete and precision programming method 2206 can begin. If $I_{cell}$ is not less than or equal to coarse target current value $I_{CT}$, then steps 1704-1705 are repeated, and i is incremented.

FIG. 18 depicts a second embodiment of coarse programming method 1305, which is adaptive calibration method 1800. The method starts (step 1801). The cell is programmed at a default start value $v_0$ (step 1802). $v_0$ is derived from a lookup table such as created from silicon characterization, where the table value includes an offset so as not to overshoot the programmed target.

In step 1803 an I-V slope parameter is created which is used in predicting the next programming voltage. A first control gate read voltage, $V_{CGR1}$, is applied to the selected cell, and the resulting cell current, $IR_1$, is measured. Then a second control gate read voltage, $V_{CGR2}$, is applied to the selected cell, and the resulting cell current, $IR_2$, is measured. A slope is determined based on those measurements and stored, for example as according to the equation in sub threshold region (cell operating in sub threshold):

$$slope = (V_{CGR1} - V_{CGR2})/(LOG(IR_1) - LOG(IR_2))$$

(step 1803). Examples of values for $V_{CGR1}$ and $V_{CGR2}$ are 1.5V and 1.3V, respectively.

Determining the slope information allows for a $v_{increment}$ value to be selected that is customized for the particular cell in question. This ultimately will make the programming process shorter.

When step 1804 is repeated, i is incremented, a new desired programming voltage, $v_i$, is determined based on the stored slope value and a current target $I_{CT}$ and offset value using an equation such as the following:

$$v_i = v_{i-1} + v_{increment},$$

where for i–1, $v_{increment}$=alpha*slope*(LOG(IR1)–LOG($I_{CT}$)), where $I_{CT}$ is the coarse target current and alpha is a predetermined constant <1 (programming offset value) to prevent overshoot, e.g., 0.9.

The cell is then programmed using Vi. (step 1805) Here, $v_i$ can be applied to the source line terminal, control gate terminal, or erase gate terminal of the selected cell, depending on the programming scheme used.

Next, a verify operation occurs, wherein a read operation is performed on the selected cell and the current drawn through the selected cell ($I_{cell}$) is measured (step 1806). If $I_{cell}$ is less than or equal to coarse target threshold value $I_{CT}$, where coarse target threshold value $I_{CT}$ is set=$I_D+I_{CTOFFSET}$, where $I_{CTOFFSET}$ is an offset value added to prevent program overshoot, then the process proceeds to the step 1807. If not, then the process returns to step 1804 and i is incremented.

In step 1807, $I_{cell}$ is compared against a threshold value, $I_{CT2}$, that is smaller than coarse target threshold value $I_{CT}$. The purpose of this is to see if an overshoot has occurred. That is, although the goal is for $I_{cell}$ to be below coarse target threshold value $I_{CT}$, if it falls too far below coarse target threshold value $I_{CT}$, then an overshoot has occurred and the stored value may actually correspond to the wrong value. If $I_{cell}$ is not less than or equal to $I_{CT2}$, then no overshoot has occurred, and adaptive calibration method 1800 has completed, as which point the process progresses to precision programming method 1306. If $I_{cell}$ is less than or equal to $I_{CT2}$, then an overshoot has occurred. The selected cells are then erased (step 1808), and the programming process starts over at step 1802 with adjusted $V_{increment}$ such as having smaller value depending on how much it overshoots. Optionally, if step 1808 is performed more than a predetermined number of times, the selected cell can be deemed a bad cell that should not be used.

The precision program method 1306 consists of multiple verify and program cycles, in which the program voltage is incremented by a constant fine voltage with a fixed pulse width or in which the program voltage is fixed and the program pulse width is varied or constant for next pulses, as described above in relation to FIG. 15.

Optionally, the step of determining if the current through the selected non-volatile memory cell during a read or verify operation is less than or equal to the first threshold current value, $I_{CT}$, can be performed by applying a fixed bias to a terminal of the non-volatile memory cell, measuring and digitizing the current drawn by the selected non-volatile memory cell to generate digital output bits, and comparing the digital output bits to digital bits representing the first threshold current value, $I_{CT}$.

Optionally, the step of determining if the current through the selected non-volatile memory cell during a read or verify operation is less than or equal to the first threshold current value, $I_{CT}$, can be performed by applying an input to a terminal of the non-volatile memory cell, modulating the current drawn by the non-volatile memory cell with an input pulse to generate a modulated output, digitizing the modulated output to generate digital output bits, and comparing the digital output bits to digital bits representing the first threshold current, $I_{CT}$.

FIG. 19 depicts a third embodiment of programming method 1305, which is absolute calibration method 1900. The method starts (step 1901). The cell is programmed at a default starting value $v_0$ (step 1902). The control gate voltage of the cell (VCGRx) is measured at a current target value Itarget and stored (step 1903). A new desired voltage, $v_1$, is determined based on the stored control gate voltage and the current target value Itarget and an offset value, Itarget+Ioffset (step 1904). For example, the new desired voltage, $v_1$, can be calculated as follows: $v_1$=$v_0$+theta* (VCGBIAS−stored VCGR), theta is about 1, VCGBIAS is the default read control gate voltage at a maximum target current, typically ~1.5V, and stored VCGR is the measured read control gate voltage of step 1903. In short, the updated program voltage is adjusted based on the difference between the measured control gate voltage and the target control gate voltage.

The cell is then programmed using $v_i$. When i=1, the voltage $v_1$ from step 1904 is used. When i>=2, the voltage $v_i$=$v_{i-1}$+$V_{increment}$ is used. $V_{increment}$ can be determined from a lookup table storing values of $v_{increment}$. vs. target current value, $I_{CT}$. Next, a verify operation occurs, wherein a read operation is performed on the selected cell and the current drawn through the selected cell ($I_{cell}$) is measured (step 1906). If $I_{cell}$ is less than or equal to coarse target current value $I_{CT}$, then absolute calibration method 1900 is complete and precision programming method 1306 can begin. If $I_{cell}$ is not less than or equal to coarse target current value $I_{CT}$, then steps 1905-1906 are repeated, and i is incremented.

Alternatively, coarse and/or fine program methods may comprise of increments of the program voltage on one terminal (e.g., CG) and decreasing voltage on another terminal (e.g., EG or SL) for more precise control of charge coupling into the floating gate.

Figure 20:
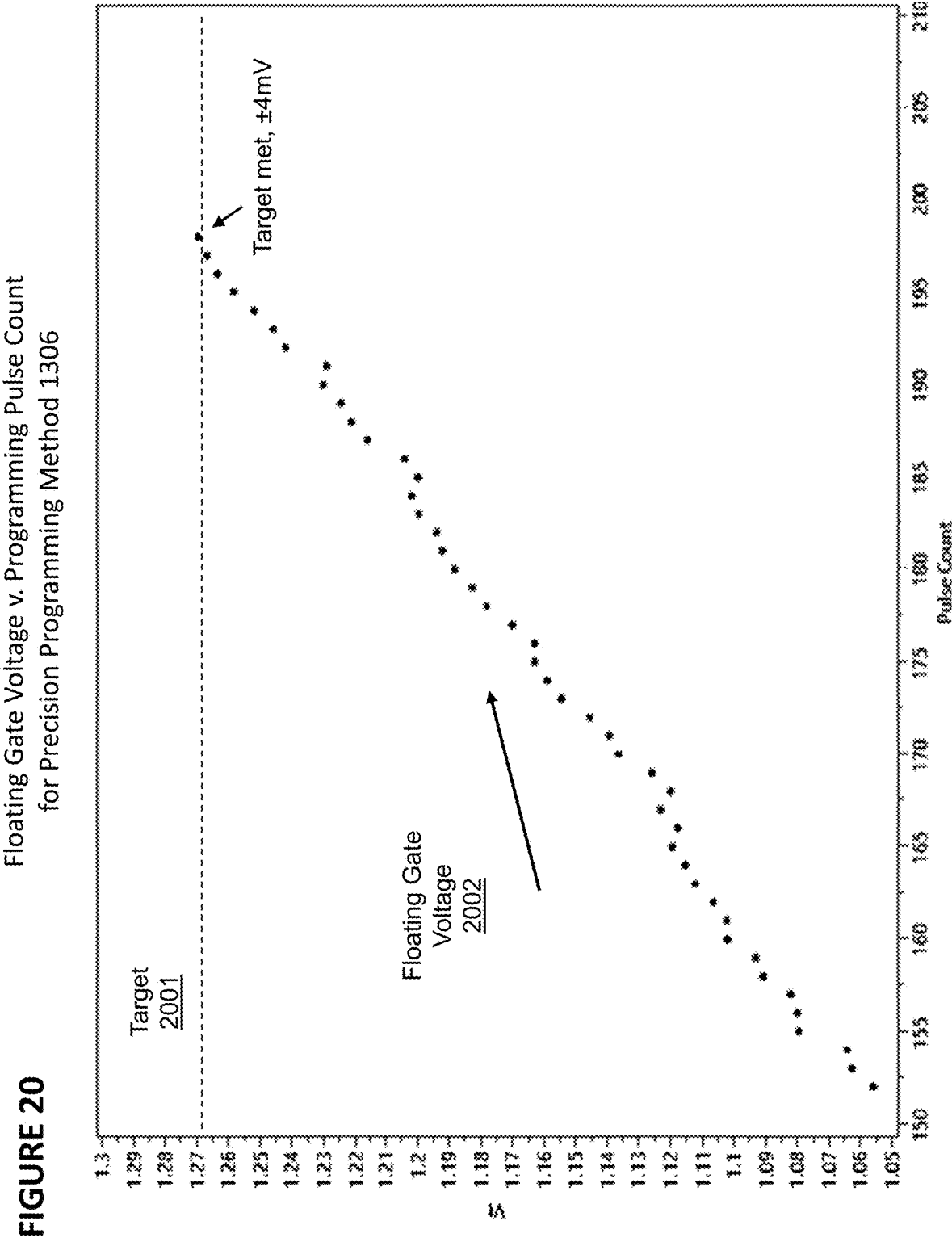
FIG. 20 depicts the floating gate voltage of a selected memory cell during a sequence of programming pulses.

The coarse and precision programming methods described thus far will be precise enough for most systems. However, even these methods have a limit on their precision. Ultimate precision can be understood to be one electron precision. FIG. 20 depicts data collected by Applicant for a working embodiment of the coarse and precision programming methods described above. FIG. 20 depicts the floating gate voltage against the number of programming pulses executed in an attempt to program floating gate voltage 2002 as close to target 2001 as possible. As can be seen, floating gate voltage 2002 is able to approximate target 2001 within +/−4 mV, which is equivalent to the charge of a single electron added to the floating gate. This might not be sufficiently precise for certain systems. For example, if N (the number of different values that can be held on any floating gate) is large (e.g., 512), then greater precision than +/−4 mV may be required, meaning that sub-electron (fractional electron) precision programming may be required; that is, a mechanism is needed where the floating gate voltage can be adjusted in increments smaller than +/−4 mV, meaning that somehow a fraction of an electron must be added or subtracted from the floating gate. Also, it can be seen that the increments in floating gate voltage during the programming process are not uniform and predictable, which means that the system will not always achieve a given target voltage with complete precision. This may be due to statistically nature of the programming physics.

Embodiments for Ultra-Precision Programming of Cells in a VMM

FIGS. 21-28 depict embodiments of an ultra-precision programming method and system that allow for more precise programming than can be achieved through coarse programming method 1305 and precision programming method 1306 alone. The ultra-precision programming method and system enable the voltage of the floating gate of a selected memory cell to increase by the charge equivalent to a fraction of a single electron (a sub-single electron) being added to the floating gate for each programming pulse, which is the finest programming increment that is physically possible.

Figure 21:
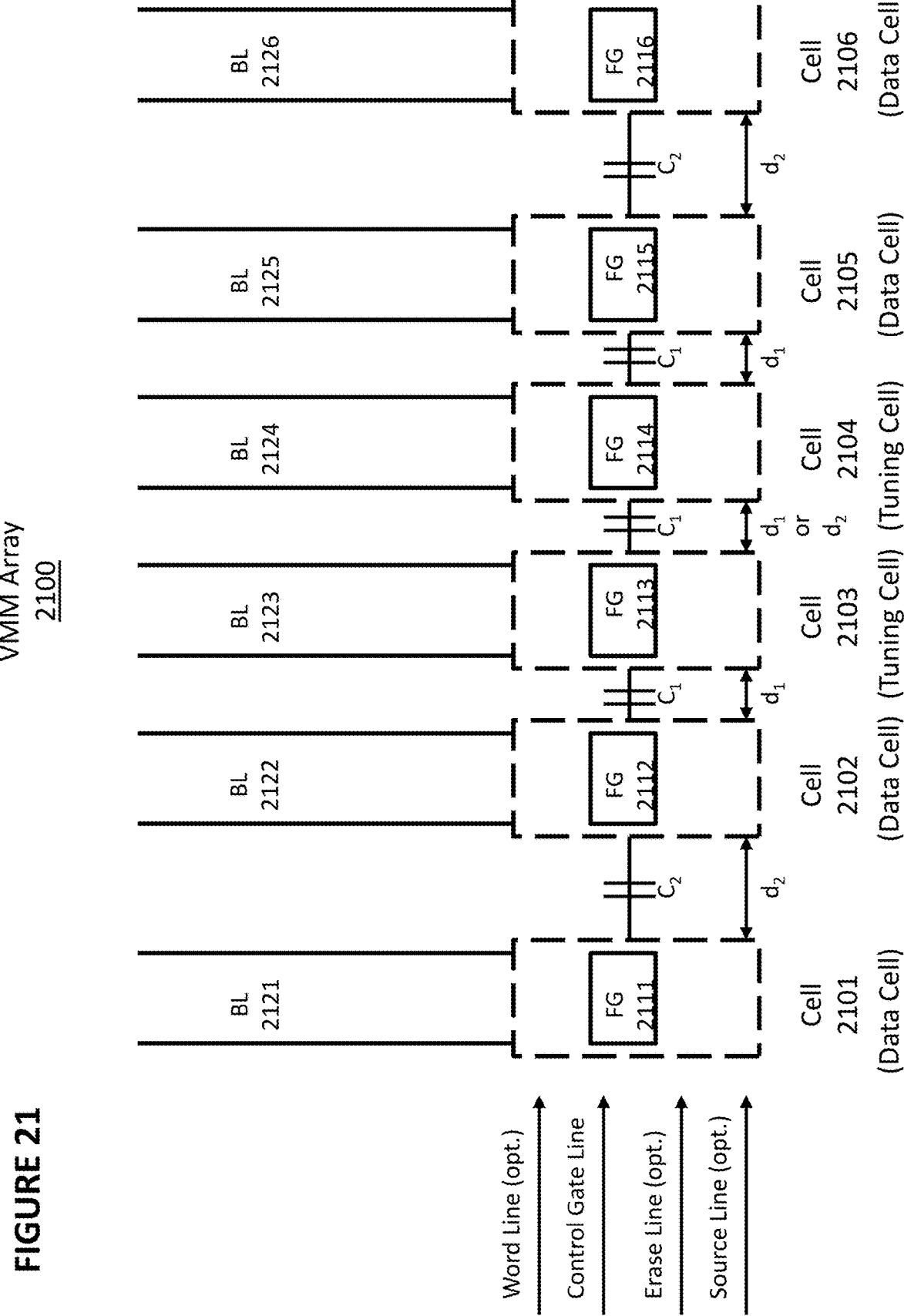
FIG. 21 depicts a VMM array that is capable of ultra-precise programming.

FIG. 21 depicts VMM array 2100, which comprises rows and columns of non-volatile memory cells. Here, part of one row of memory cells is shown, specifically, data memory cell 2101, data memory cell 2102, tuning memory cell 2103, tuning memory cell 2104, data memory cell 2105, and data memory cell 2106, which are coupled to bit lines 2121, 2122, 2123 (Tuning BL), 2124 (Tuning BL), 2125, and 2126, respectively, and to a control gate line and optionally to a word line, erase line, and/or source line, depending on which type of memory cell architecture is used (e.g., memory cells 210, 310, 410, 510, 610, 710, or 810). Data memory cell 2101 comprises floating gate 2111, data memory cell 2102 comprises floating gate 2112, tuning memory cell 2103 comprises floating gate 2113, tuning memory cell 2104 comprises floating gate 2114, data memory cell 2105 comprises floating gate 2115, and data memory cell 2106 comprises floating gate 2116. Tuning BL 2123 and 2124, respectively, are the bitlines used to perform ultra-precision tuning for an adjacent bitline.

As is typically the case, there is a capacitive coupling between adjacent floating gates in the same row as shown in FIG. 21. VMM array 2100 utilizes this phenomena to achieve ultra-precise programmability. In this example, data memory cell 2102 is used to store data, but tuning memory cell 2103 is not used to store data and instead is used solely to assist in programming cell 2102 through capacitive coupling. Similarly, data memory cell 2105 is used to store data but tuning memory cell 2104 is used solely to assist in programming cell 2105 through capacitive coupling. Data memory cells 2101 and 2106 are used to store data and their programming is assisted by adjacent tuning cells not shown.

In one embodiment, notably, when data memory cells are adjacent to one another, they are separated by a distance $d_2$, as shown for data memory cells 2101 and 2102, and for data memory cells 2105 and 2106. However, when a data memory cell is adjacent to a tuning memory cell, they are separated by a distance $d_1$, as shown for data memory cell 2102 and adjacent tuning memory cell 2103, and data memory cell 2104 and adjacent tuning memory cell 2105. When a tuning memory cell is adjacent to another tuning memory cell, they can be separated by a distance $d_1$ or $d_2$, as shown for tuning memory cells 2103 and 2104. By design, $d_2 > d_1$. As a result, the capacitive coupling between cells that are apart by a distance $d_2$ has a capacitance of $C_2$, while the capacitive coupling between cells that are apart by a distance $d_1$ has a capacitance of $C_1$, where $C_1 > C_2$. That is, the capacitance is greater between cells that are closer to one another. Further, the distance $d_1$ may be designed to achieve a desired value of $C_1$ to optimize the effect of the tuning memory cell on the data memory cell and thus the final programming precision.

If data memory cell 2102 is the selected cell and it is desired to program data memory cell 2102 to a certain target value, data memory cell 2102 can be programmed to a certain degree using the coarse and precision programming methods described previously with reference to FIGS. 13-20. However, before the target value is achieved or exceeded, the coarse programming and precision programming are stopped, and an ultra-precise programming method is implemented instead.

Specifically, tuning memory cell 2103 is programmed using coarse and precise programing methods. Due to capacitive coupling, as tuning memory cell 2103 is programmed, the charge in floating gate 2113 will cause the charge on floating gate 2112 to also increase, but by a lesser amount than the increase in charge of floating gate 2113. Through this mechanism, floating gate 2112 will increase by a finer increment than occurs in floating gate 2113 or which could be achieved by programming cell 2102 directly using coarse and precision programming methods 1305 and 1306. In this case, programming is performed on the tuning memory cell 2103 but a verify operation only needs to be performed on data memory cell 2102. Once the target value is achieved in data memory cell 2102, floating gate 2113 is maintained in its state of charge so that floating gate 2112 remains at the target value.

Figure 22:
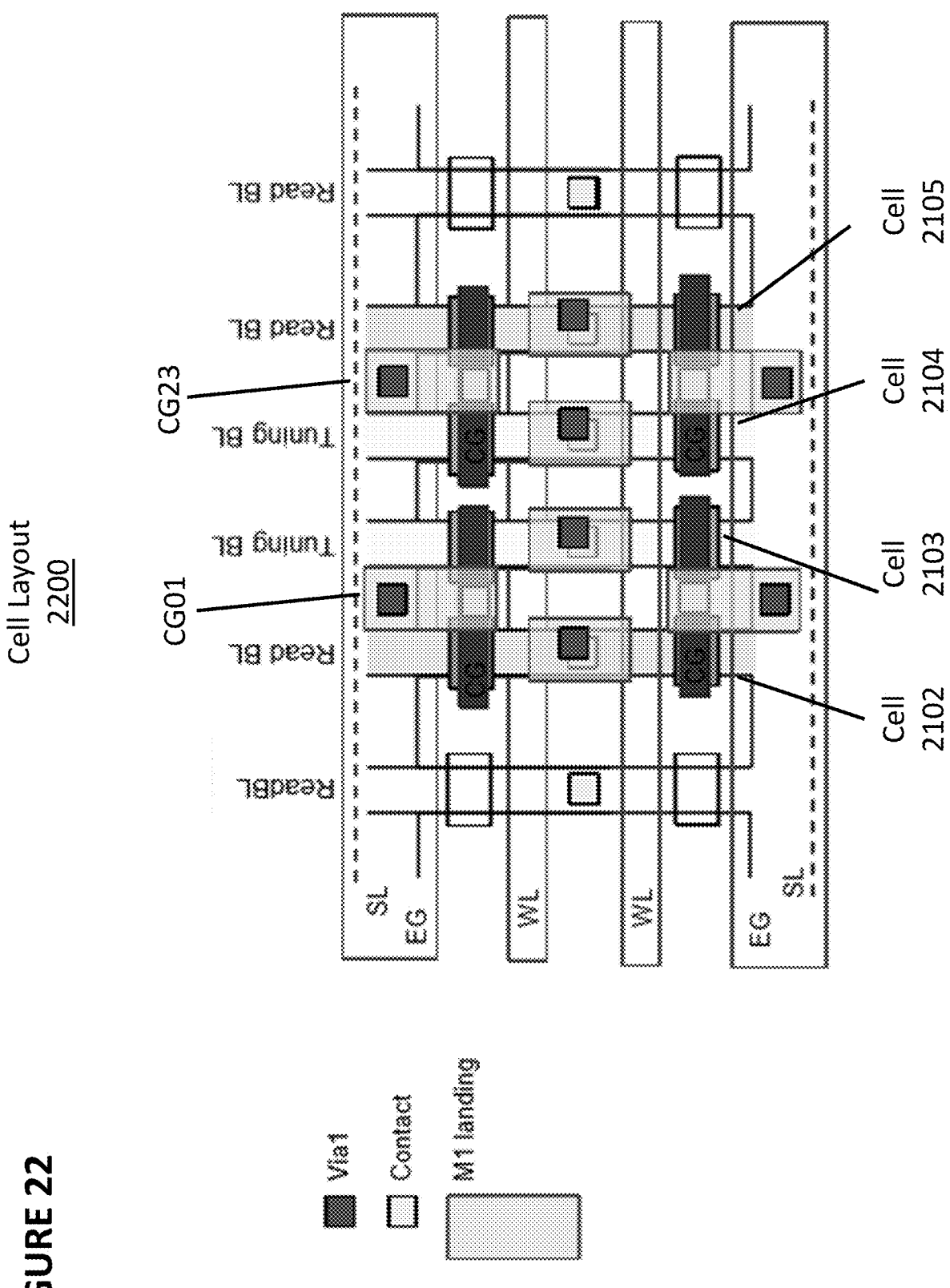
FIG. 22 depicts a cell layout for the VMM array of FIG. 21.

FIG. 22 depicts exemplary layout 2200 for data memory cell 2102, tuning memory cell 2103, tuning memory cell 2104, and data memory cell 2105 for a system with bi-directional tuning (meaning both programming and erasing can be used for tuning purposes due to the erase gate being horizontal and the control gate being vertical, meaning the control gate is orthogonal to the erase gate; similarly, the control gate or word line can be orthogonal to the source line). Here, CG gates are shared for two adjacent columns vertically. In the case of a cell which may utilize bi-directional tuning, the ultra precision tuning may be accomplished by erasing or programming the tuning cell or both.

FIG. 23 depicts an alternative embodiment that utilizes VMM array 2100. Here, memory cell 2102 is used to store a positive value (W+), and memory cell 2105 is used to store a negative value (W−), and these together store the value W, where W=(W+)−(W−), which can be achieved by a subtraction circuit during a read or verify operation. In this embodiment, a tuning cell, such as tuning cells 2103 and 2104, is programmed with a weight used to tune the adjacent data cell to an opposite weight. Accordingly, for example, bit line 2123 programs tuning memory cell 2103 to cause capacitive coupling to decrease the voltage of floating gate 2112 in cell 2102, and bit line 2124 programs tuning memory cell 2104 to cause capacitive coupling to decrease the voltage of floating gate 2115 in memory cell 2105.

Figure 24:
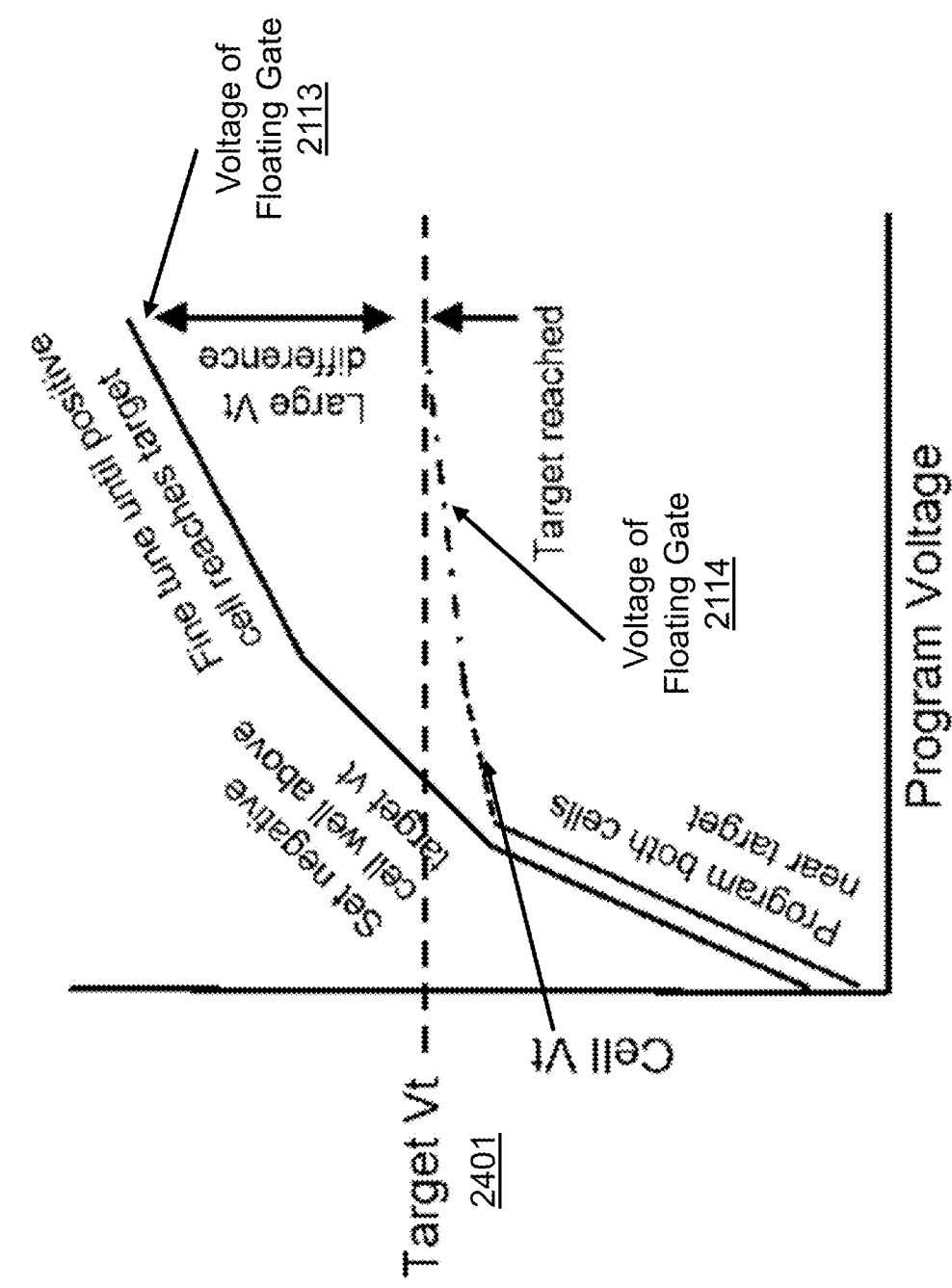
FIG. 24 depicts the floating gate voltage of a selected memory cell during a sequence of programming pulses

FIG. 24 depicts the effect of a tuning memory cell on an adjacent data memory cell, for instance, tuning memory cell 2103 and data memory cell 2102 as in FIG. 21. Initially, data memory cell 2102 and tuning memory cell 2103 are both programmed near target voltage 2401, but still below it. Then, tuning memory cell 2103 is programmed such that the voltage of floating gate 2113 may exceed target voltage 2401. The voltage on floating gate 2112 is verified (through a read verify operation), and tuning memory cell 2103 continues to be programmed until data memory cell 2102 achieves the exact target voltage 2401. This process results in charge equivalent to a sub-single electron potential being added to floating gate 2112 during a programming pulse, which is the finest increment of programming that is physically possible.

Figure 25A:
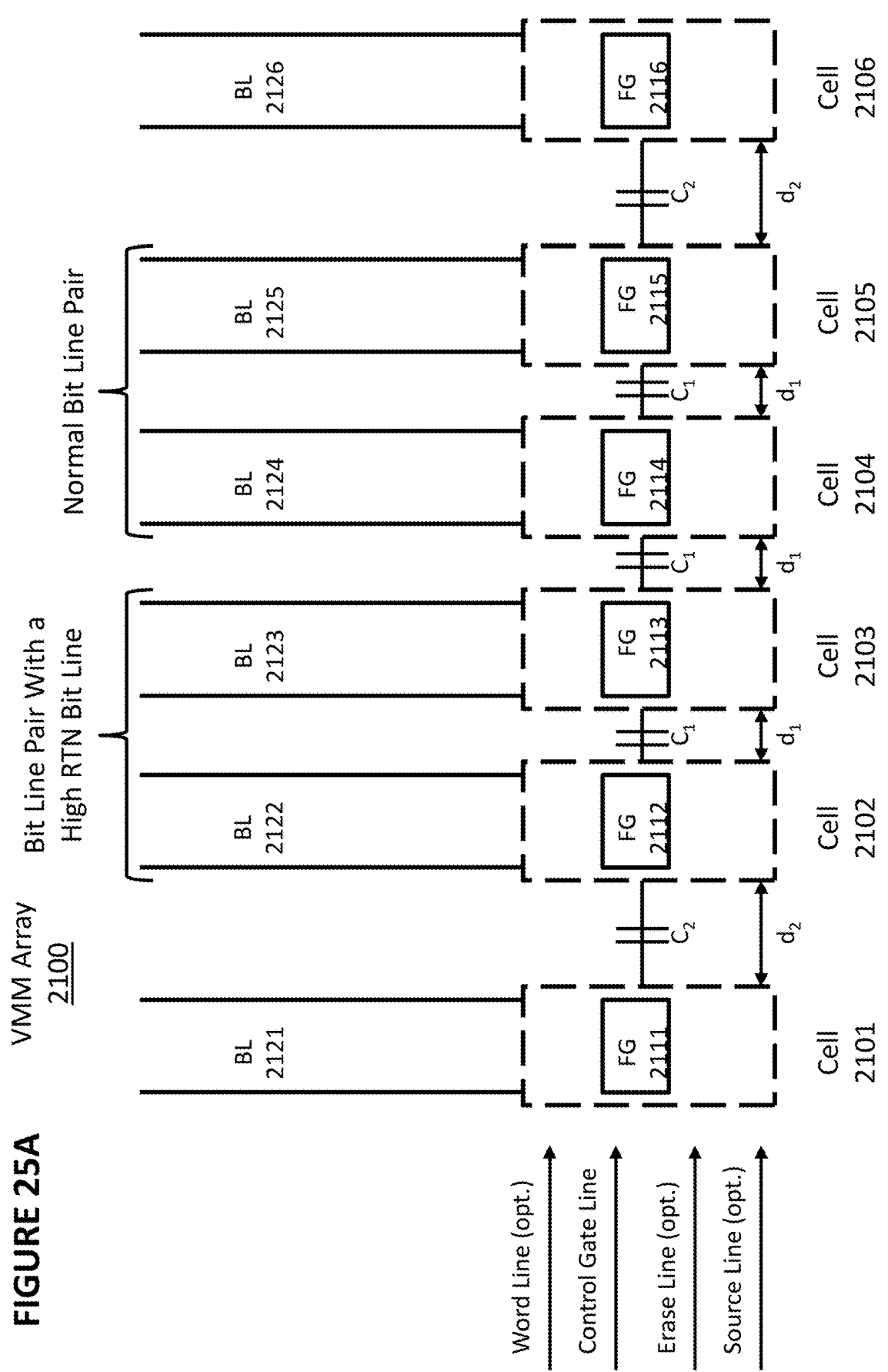
FIG. 25A depicts a VMM array that is capable of ultra-precise programming, where adjacent cells are read together to reduce noise.
Figure 25B:
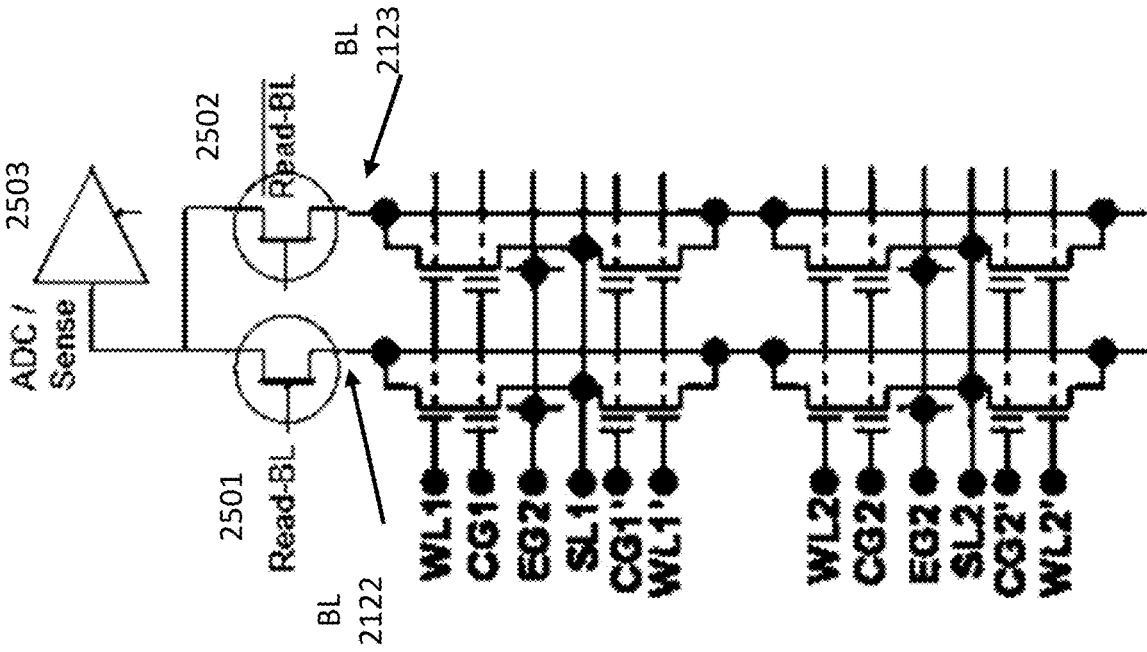
FIG. 25B depicts a schematic of adjacent cells read together by a sense amplifier.

FIG. 25A depicts another alternative embodiment that utilizes VMM array 2100. Here, the tuning bitline and data bitline (constituting a bitline pair) are inter-changeable. For example, the bitline within a bitline pair that has the greater amount of noise (such as random telegraph noise RTN) can be designated as the tuning bitline within the bitline pair. For example, if memory cell 2102 has greater RTN noise than memory cell 2103, bitline 2122 can be designated as a tuning bitline, i.e. memory cell 2102 is designated as a tuning memory cell, and bitline 2123 as a data bitline, i.e. memory cell 2103 is designated as a data memory cell. FIG. 25B shows schematically how this is done. Both bit lines 2122 and 2123 are fed as an input into sense amplifier 2503 through bitline read transistors 2501 and 2502, respectively. The bitline that has less RTN noise than the other bitline will be designated as a data bit line, i.e. the associated memory cell is a designated as a data memory cell. The cells in the bit line pairs are separated by distance $d_1$, with inherent capacitance $C_1$ between their respective floating gates. Cells that are not used as pairs, may be separated from adjacent cells by distance $d_2$, which as indicated above is greater than distance $d_1$, with a resultant capacitance of $C_2$, which is less than $C_1$.

FIG. 26 depicts ultra-precision programing method 2600. The method starts (step 2601). The selected data memory cell and its adjacent tuning memory cell are erased (step 2602). Un-selected memory cells are deeply programmed (step 2603). Coarse programming is performed on selected data memory cells (step 2604). Precision programming using increments and/or decrements is performed on selected data memory cells (step 2605), and/or precision programming using a constant voltage is performed on selected data memory cells (step 2605). Then ultra-precision programming is performed using the capacitive coupling between the adjacent tuning memory cell and the selected data memory cell (step 2607). Once the target value is achieved, the method ends (step 2608).

Figure 27:
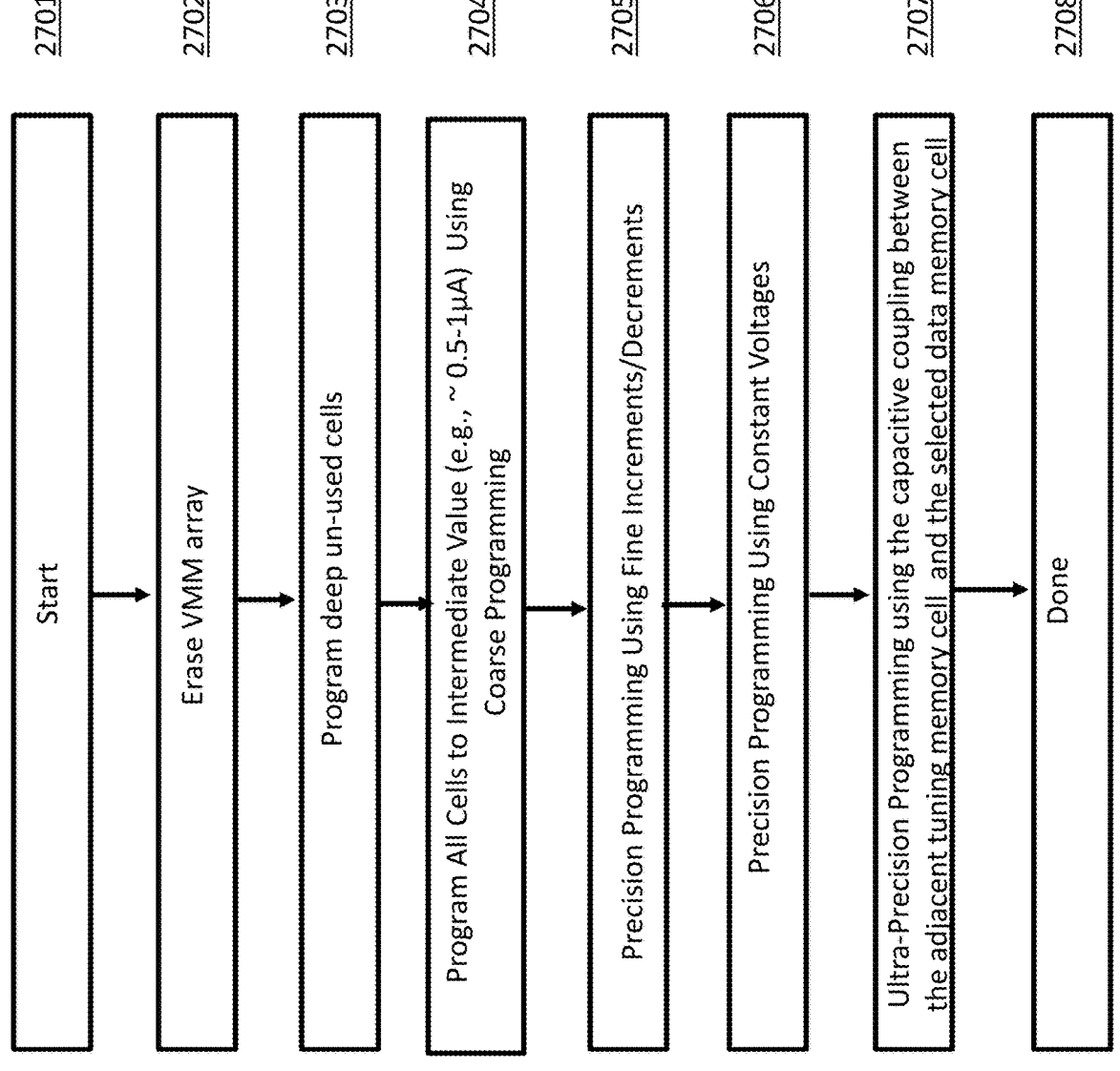
FIG. 27 depicts another ultra-precise programming method.

FIG. 27 depicts ultra-precision programing method 2700. The method starts (step 2701). The entire VMM array is erased (step 2702). Un-selected cells are deeply programmed (step 2703). All cells are programmed to an intermediate value (e.g., ~0.5-1 µA) using coarse programming (step 2704). Precision programming using increments is performed on selected data memory cell(s) (step 2705), and/or precision programming using constant voltages is performed on selected data memory cell (step 2706). Then ultra-precision programming is performed using the capacitive coupling between the adjacent tuning memory cell and the selected data memory cell (step 2707). Once the target value is achieved, the method ends (step 2708).

In the embodiments described above, when a selected data memory cell is read or verified, its associated tuning memory cell also must be read or verified, as the capacitive coupling must be active at the time the data memory cell is read or verified. One way to do this is to couple the data bitline and the tuning bitline to the sense amplifier during a read or verify operation.

Figure 28:
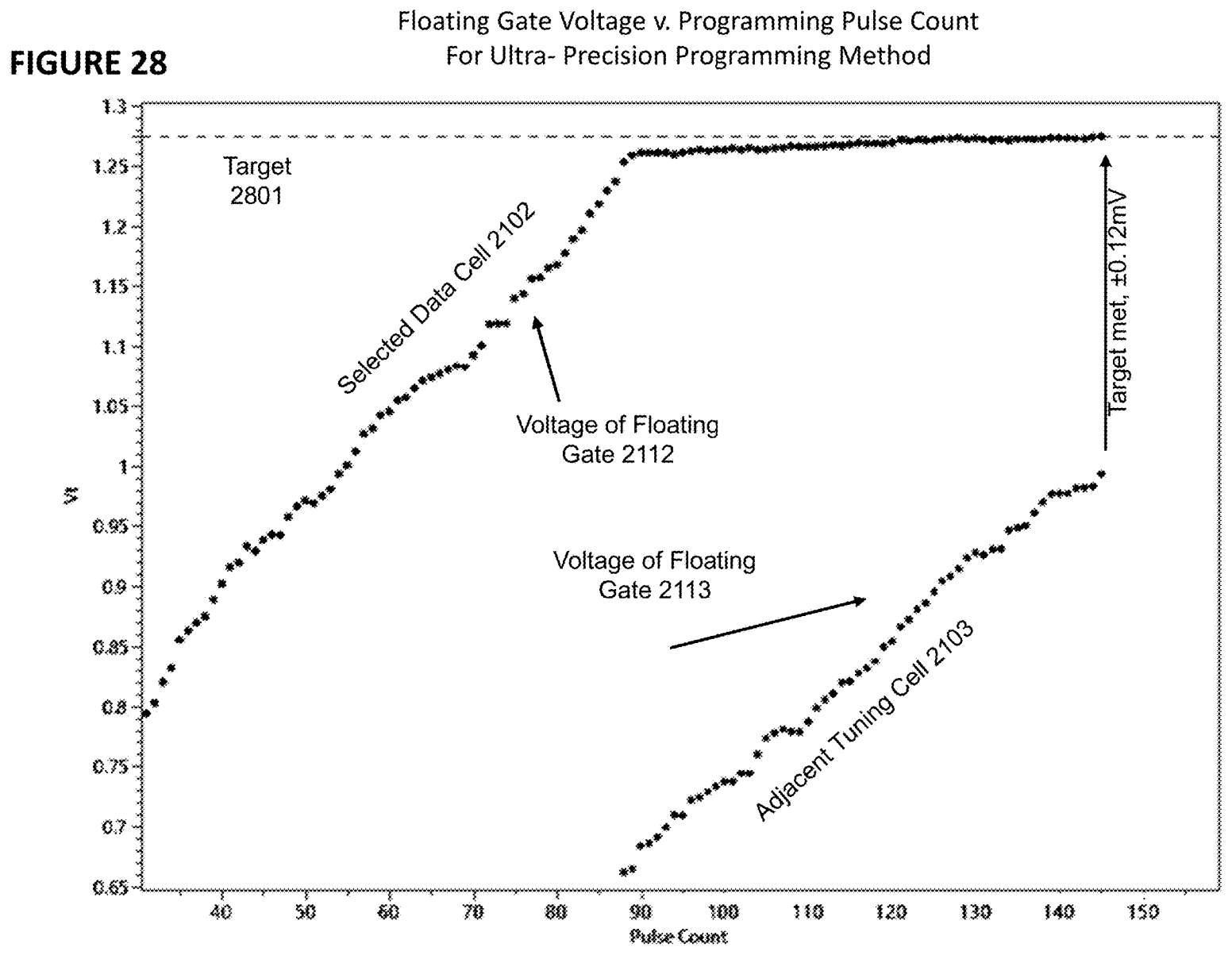

The end result of ultra-precision programming is shown in FIG. 28, which depicts data collected by Applicant for a working embodiment of the ultra-precision programming methods and systems described herein. FIG. 28 depicts the floating gate voltage of a data memory cell (e.g. 2102) and an adjacent tuning memory cell (e.g. 2103) against the number of programming pulses executed in an attempt to program the voltage of floating gate 2112 exactly to target 2801, by programming floating gate 2113 in the adjacent tuning memory cell 2103. The selected data memory cell 2102 is first programmed up to just under 90 pulses, and the balance of the programming is done by only providing programming pulses to adjacent tuning memory cell 2103. As can be seen, ultra-precision programming is much more precise than coarse programming and fine programming methods alone (depicted in FIG. 20), and the increment in voltage to floating gate 2112 due to capacitive coupling between floating gates 2112 and 2113 actually corresponds to less than one electron being added per programming pulse to floating gate 2112.

Another embodiment for ultra-precision programming uses vertical floating gate to floating gate coupling instead of horizontal floating gate to floating gate coupling such as describe above with reference to the tuning bitline. In this case, an adjacent row (the Tuning Row) is used for coupling purpose. This is particular suited for memory cells 210, 310, 510, and 710, in which case there is no physical barrier (erase gate) in the top FG and bottom FG.

Another embodiment for ultra-precision programming uses overlapping floating gate to floating gate coupling, such as where a tuning cell floating gate is overlapped with a target cell floating gate. The overlapping is such as when one floating gate is partially on top of another floating gate.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of programming a first memory cell in a neural memory to a target value, comprising:

programming a second memory cell by applying programming voltages to terminals of the second memory cell;

determining if an output of the first memory cell has reached the target value; and if the output of the first memory cell has not reached the target value, repeating the programming and determining until the output of the first memory cell has reached the target value.

2. The method of claim 1, wherein the second memory cell is adjacent to the first memory cell.

3. The method of claim 1, wherein the first memory cell is coupled to a data bitline and the second memory cell is coupled to a tuning bitline.

4. The method of claim 1, wherein the first memory cell and the second memory cell are contained in an analog neural memory array.

5. The method of claim 1, wherein for each repeating operation, increasing one or more of the programming voltages applied to the terminals of the second memory cell.

6. The method of claim 1, wherein the same programming voltages are used during each repeating operation.

7. The method of claim 1, wherein the terminals of the second memory cell comprise a bit line terminal, a source line terminal, and a word line terminal.

8. The method of claim 7, wherein the terminals of the second memory cell further comprise a control gate terminal.

9. The method of claim 8, wherein the control gate terminal of the first memory cell is connected to a control gate line, and wherein the control gate line is connected to control gate terminals of a column of cells containing the first memory cell and an adjacent column of cells containing the second memory cell.

10. The method of claim 8, wherein the terminals of the second memory cell further comprise an erase gate terminal.

11. The method of claim 10, wherein the control gate is orthogonal to the erase gate.

12. The method of claim 10, wherein the control gate is orthogonal to the source line.

13. The method of claim 1, wherein the first memory cell and the second memory cells are split-gate memory cells.

14. The method of claim 1, wherein the first memory cell and the second memory cell are stacked-gate memory cells.

15. The method of claim 1, wherein a charge equivalent to a sub-single electron is added to the floating gate of the first memory cell during the programming.

16. The method of claim 1, wherein the first memory cell and the second memory cell are contained within an array comprising a plurality of pairs of adjacent data cells and tuning cells.

17. The method of claim 16, wherein a distance between adjacent data cells is greater than a distance between an adjacent data cell and tuning cell.

18. The method of claim 1, wherein during the determining, a bit line coupled to the first memory cell and a bit line coupled to the second memory cell are both coupled to a sense amplifier.

19. The method of claim 1, further comprising:

performing coarse programming on the first memory cell.

20. The method of claim 1, further comprising:

performing coarse programming on the first memory cell; and performing precision programming on the first memory cell.

21. A method of programming a first memory cell in a neural memory to a target value, comprising:

determining which bitline in a pair of adjacent bitline contains greater noise and designating that bitline as a tuning bitline and designating the other bitline in the pair as a data bitline;

programming a second memory cell coupled to the tuning
bitline by applying programming voltages to terminals
of the second memory cell;
determining if an output of the first memory cell coupled
to the data bitline has reached the target value.

* * * * *